US006937969B1

(12) United States Patent
Vandersteen et al.

(10) Patent No.: US 6,937,969 B1
(45) Date of Patent: Aug. 30, 2005

(54) METHOD FOR DETERMINING SIGNALS IN MIXED SIGNAL SYSTEMS

(75) Inventors: Gerd Vandersteen, Sint-Pieters-Leeuw (BE); Pierre Wambacq, Groot-Bijgaarden (BE); Yves Rolain, Halle (BE); Petr Dobrovolny, Brno (CZ)

(73) Assignees: Interuniversitair Microelektronica Centrum (IMEC), Leuven (BE); Vrije Unirversiteit Brussel, Brussels (BE)

( * ) Notice: Subject to any disclaimer, the term of this patent is extended or adjusted under 35 U.S.C. 154(b) by 846 days.

(21) Appl. No.: 09/591,026

(22) Filed: Jun. 9, 2000

Related U.S. Application Data

(60) Provisional application No. 60/209,400, filed on Jun. 1, 2000, provisional application No. 60/138,642, filed on Jun. 10, 1999.

(51) Int. Cl.[7] ............................................. G06F 17/50
(52) U.S. Cl. ........................ 703/14; 703/13; 703/15; 703/19; 716/6
(58) Field of Search .............................. 703/2, 15, 13, 703/14; 375/302, 350, 260; 716/6

(56) References Cited

U.S. PATENT DOCUMENTS

| | | | | |
|---|---|---|---|---|
| 5,369,404 A | * | 11/1994 | Galton | 341/143 |
| 5,870,308 A | * | 2/1999 | Dangelo et al. | 716/18 |
| 6,181,754 B1 | * | 1/2001 | Chen | 375/350 |
| 6,252,909 B1 | * | 6/2001 | Tzannes et al. | 375/260 |
| 6,263,027 B1 | * | 7/2001 | Yang et al. | 375/302 |
| 6,470,482 B1 | * | 10/2002 | Rostoker et al. | 716/6 |
| 6,480,816 B1 | * | 11/2002 | Dhar | 703/14 |
| 6,606,588 B1 | * | 8/2003 | Schaumont et al. | 703/15 |

OTHER PUBLICATIONS

"MATLAB Version 5.2", The Math Works, Jan. 1998.*
"Equalisation in a Multi-carrier Code Division Multiple Acess Muli-Rate System", L. Freiberg, IEEE 0-7803-3143-5, IEEE 1996.*
"Performance of a Multi-rate CDMA Packet Data System", R. Walton, IEEE 0-7803-4872-9/98, IEEE 1998.*
"Introduction to MATLAB" T. Weiss, MIT Signals and Systems—6.003, Fall 1999.*
"Modelling Overlapped Discret Multicarrier Modulation Systems Using Synchronous Dataflow in the Ptolemy Environment", L. Win, Proceedings of ICSP 96', pp. 111-114, IEEE 1996.*
"Multirate schemes for mulitmedia applications in DS/CDMA Systems", T. Ottosson, RVK 96' NUTEK Conference on Radio Sciences and Telecommunications, Jun. 1996.*

(Continued)

Primary Examiner—Jean R. Homere
Assistant Examiner—Fred Ferris
(74) Attorney, Agent, or Firm—Knobbe Martens Olson & Bear LLP

(57) ABSTRACT

Simulation methods and simulators are presented which operate on a computer under software control. Said computer simulation methods and simulators are specially suited for simulating digital circuits and mixed analog digital circuits. The methods enable efficient simulation, meaning resulting in a fast simulation while still obtaining accurate results. With fast simulation is meant that the simulation can be completed in a short simulation time. Accurate means that the signals obtained or determined by simulation are good approximations of the signals that would be measured when the circuit, which representation is under simulation, is actually running in real world. Indeed the simulation methods and the related simulation apparatus or simulator exploits a representation of a circuit.

7 Claims, 14 Drawing Sheets

OTHER PUBLICATIONS

Yah Wah Michael Chia et al., "Novel adaptive linearization scheme for multicarrier power amplifier using samples of multiple channels (SMC)", Vehicular Technology Conference, IEEE, May 1999, pp. 1084-1088.

Schneider, K.W. et al., "Efficient simulation of multi-carrier digital communication systems in nonlinear channel environments". Military Communications Conference, IEEE, Oct. 1992, pp. 339-344.

Pino, J.L. et al., Cosimulating synchronous DSP applications with analog RF Circuits:, Asilomar Conference on Signals, Systems and Computers, IEEE, Nov. 1998, pp. 1710-1714.

Vandersteen, G. et al., "A methodology for efficient high-level data flow simulation of mixed-signal front-ends of digital telecom transceivers", Design Automation Conference, Jun. 2000, pp. 440-445.

Schaumont, P. et al. "Synthesis of multirate and variable rate circuits for high speed telecommunications applications", European Design and Test Conference, pp. 542-546.

How-Siang Yap, "Designing to digital wireless specifications using Circuit Envelope simulation", Asia Pacific Microwave Conference, Dec. 1997, pp. 173-176.

Potolemy of Berkley http://www.ptolemy.eecs.berkley.edu/main/htm) (Web page printed on Nov. 6, 2000.) HP-ADS of Hewlett-Packard (http://tmo.hp.com/tmo/hpeesof/products/ads/adsoview.html).

SPW of Cadence (http://www.cadence.com/software/cierto) (Web page printed on Nov. 6, 2000).

MATLAB/SIMULINK (http://www.mathworks.com/products/communications) (Web page printed on Nov. 6, 2000).

Guindi et al., "High-Level Analog Synthesis Using Signal Flow Graph Transformations", (1995) IEEE pp. 366-369.

Grimm et al.., "Repartitioning and Technology Mapping of Electronic Hybrid Systems", (1998) pp. 52-58.

Huijs, "A Graph Rewriting Approach for Transformational Design of Digital System", (1996) IEEE pp. 177-181.

Cottrell, "Event-Driven Behavioral Simulation of Analogue Transfer Functions", (1990) IEEE pp. 240-243.

Subramaniam et al., "Behavioral Modeling Techniques for Analog and Mixed Signal Design", (1994) IEEE pp. 319-322.

* cited by examiner

Baseband representation

Equivalent low-pass representation

H = cascade ($H_1$, $H_2$)

$$H(f) = (Y_{22}(f) + Y_{33}(f))^{-1}$$

H = cascade (H$_1$, H$_2$)

H = H$_1$ / (1 - H$_1$ H$_2$)

Spectral representation of an MRMC signal

METHOD FOR DETERMINING SIGNALS IN MIXED SIGNAL SYSTEMS

RELATED APPLICATIONS

This application claims priority to U.S. Provisional Patent Application Ser. No. 60/209,400; filed Jun. 1, 2000 entitled A METHOD FOR DETERMINING SIGNALS IN MIXED SIGNAL SYSTEMS and U.S. Provisional Patent Application No. 60/138,642, filed Jun. 10, 1999 entitled A METHOD FOR DETERMINING SIGNALS IN MIXED SIGNAL SYSTEMS, the disclosures of which are incorporated herein by reference in their entireties.

FIELD OF THE INVENTION

The invention relates to efficient methods and related apparatus for determining or simulating signals in systems, more in particular electrically systems such as mixed analog digital circuitry.

BACKGROUND OF THE INVENTION

With the explosion of the telecommunications market there is a strong pressure towards miniaturization and cost-effective realization of transceivers for digital telecommunications. This also affects the analog front-ends of these transceivers. As a result, there is a strong trend towards a high degree of integration of these front-ends, together with a reduction of the power consumption in combination with a high performance. In addition, the front-ends should be flexible, in order to cope with multiple standards, different bandwidths, different modulation schemes, . . . The classical superheterodyne front-end architectures do not immediately meet these requirements. For example, at the receiver side of a superheterodyne front-end the down-conversion from RF frequencies down to baseband as well as the channel filtering are performed in the analog domain. For a high flexibility it would be useful to perform the down-conversion and channel filtering at least partially in the digital domain. Further, the degree of integration of a superheterodyne front-end is low, since several high-frequency bandpass filters are required. These filters cannot be integrated easily with silicon IC technologies. Even if it would be possible to realize these filters either on chip with non-standard technology steps such as micromachining, or on an insulating MCM substrate, an architectural study is required since such filter realizations will most likely have a different performance than the commercially available bandpass filters (e.g. SAW filters). Hence, it is clear that for the design of miniaturized transceivers at a low cost, with low power and a high performance, serious efforts will be required for the architectural design of the front-ends, yielding extensions or alternatives to superheterodyne architectures. Traditionally, architectural design of mixed-signal front-ends is performed manually, using experience and simplified calculations. This approach, however, yields specifications for the analog circuits that are often too conservative. Further, such study often excludes the exploration of new architectures. In the last few years attempts have been made to use simulations during the architectural design. In this way, one could make architectural explorations without actually having to design each alternative.

Several solutions have been proposed for high-level simulation of mixed-signal architectures. Such simulations are often based on an extension of a high-level simulation approach of digital systems. Current state of the art software for system level simulations can be found in both free (Ptolemy) and commercial tools (MATLAB, HP-ADS, SPW). [Ptolemy of Berkley], [HP-ADS of Hewlett-Packard], [SPW of Cadence], [MATLAB/SIMULINK].

All available tools use a baseband and/or an equivalent low-pass signal to represent signals. Major drawbacks of these tools are the following:

A signal consists out of one baseband signal or one equivalent low-pass signal. This makes it difficult to process a modulated carrier together with its harmonics.

The numerical performance is sub-optimal in most cases. This can be a main drawback when analyzing e.g. the bit-error-rate (BER) of a system using a Monte-Carlo simulation. Only MATLAB (using block processing) gets the most numerical computations out of the computer. Feedback loops in the systems can be handled by all packages. Though, this can reduce the simulation speed significantly (e.g. MATLAB is inefficient on a sample-by-sample bases)

The parameters specified for the different analog circuits must be transformed into simulation parameter. E.g. an analog continuous-time filter must be converted into a discrete-time equivalent model in order to perform the simulations. This discrete-time equivalent is only required for simulation purposes and is furthermore of no particular interest for the designer.

Defining the parameters of the simulation environment is left to user. E.g. the sampling frequency and the carrier frequency of the bandpass simulation need to be specified by the user. This is in contrast with the fact that user is interested with certain frequency band, irrespective of the carrier frequency/sampling frequency used during the simulation.

Hewlett-Packard provides high-level mixed-signal simulation application HP-ADS by combining a high-level simulator, which was originally intended for digital systems (Ptolemy), with a dedicated analog simulator (the envelope simulator). Its main limitation comes from the fact that both the HPtolemy and the envelope simulator are not really complementary to each other. HPtolemy is a data flow simulator that can simulate with either baseband signals or equivalent low-pass signal representations. The sampling rate might change in the network, but the signals are limited to only 1 baseband signal or 1 equivalent low-pass signal. This makes it impossible to represent a signal together with its harmonics. The envelope simulator—on the contrary—is capable of representing multi-carrier signals. However, it has the main disadvantage that all carrier frequencies are common to all circuits and all circuit nodes in the envelope simulator. In addition, all circuits are simulated with one and the same sampling frequency. Hence, the envelope simulator looses a lot of performance when the sampling rates and/or the carrier frequencies change in the system.

SUMMARY OF THE INVENTION

It is a first aspect of the invention that a simulation method which exploits a flexible signal representation is presented.

In a first embodiment said flexible signal representation is represented by a sum of at least two carriers, each being modulated by a bandpass signal, wherein at least two of said bandpass signals having a different bandwidth.

In a second embodiment, flexibility of said signal representation includes that a different signal representation in either said carriers or in either the bandwidths of said bandpass signals for signal on different connections is established.

In a further aspect of the invention before performing the actual simulation, a preprocessing step at the signal representation level is provided.

In one embodiment of said aspect, a first (short) simulation is performed for establishing the required flexible signal representation before the actual speed efficient simulation is performed.

In another preprocessing step, a first signal representation is replaced by a second signal representation when a certain condition on said first signal representation is fulfilled in order to enhance the actual simulation by using said second signal representation.

In a further aspect of the invention, features of the speed efficient computation scheme are presented.

In one embodiment grouping of subcircuits with the same computation step are performed and the computation rules of grouped subcircuits are simultaneously computed.

In a second embodiment the execution of said computation rules is scheduled such that a maximal amount of computation rules can be executed in vector processing mode, meaning that a plurality of samples, related to different time values, can be computed for the related node, in a non-interupted way, meaning without requiring intermediate calculations for another node to be performed.

In a third embodiment at least one computation rule per subcircuit is executed.

In a further aspect of the invention the construction of a speed efficient computational graph is provided. Said construction can also be accomplished as a preprocessing step before the actual simulation is performed.

In a first embodiment an approach for linear subcircuits is presented, wherein providing of more than one node for a linear subcircuit is foreseen when the input signal represensations demands that.

In a second embodiment an approach for nonlinear subcircuits is presented wherein the signal representation of the input signals is taken into account for selection of a computation method.

In a third embodiment an approach for dealing with compatibility problems when dealing with different time sampling of connected subcircuits or computational nodes is presented, by adding dedictated nodes.

DETAILED DESCRIPTION OF THE PREFERRED EMBODIMENT

Figure 1:
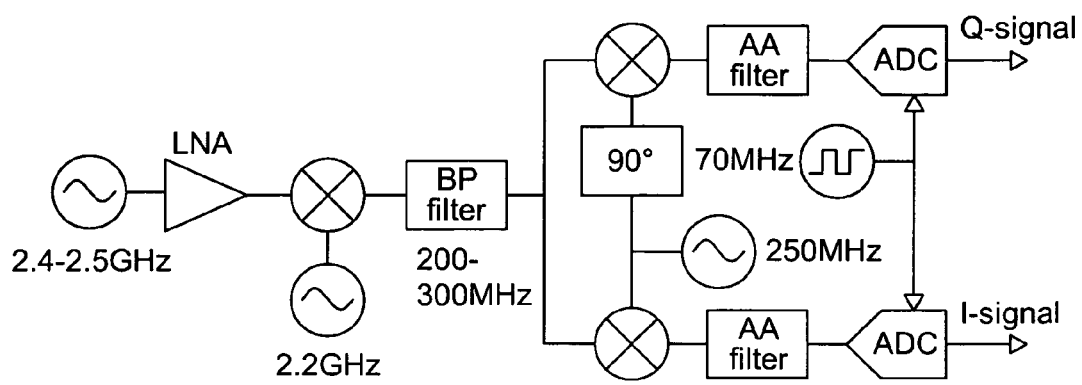
FIG. 1 is a block diagram of a receiver front end, being a typical mixed signal system.
Figure 2:
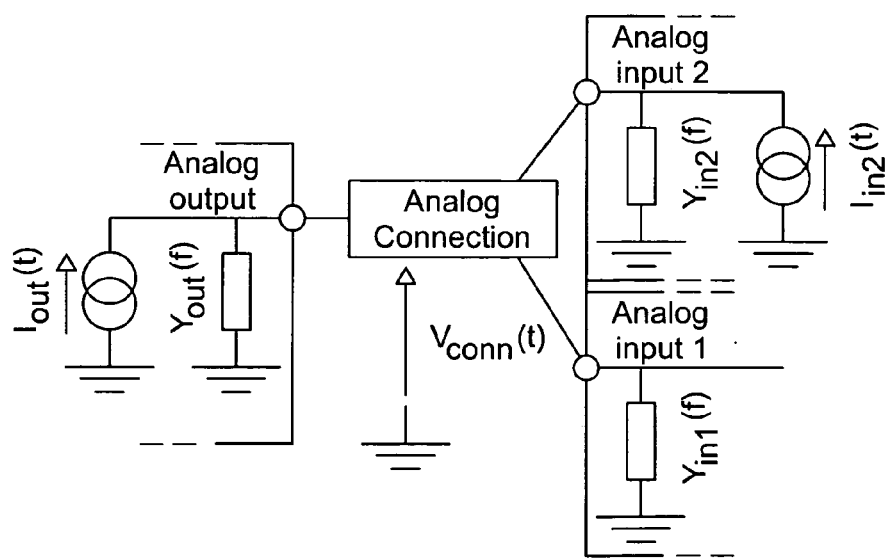
FIG. 2 is a block diagram of a mixed signal system.

The invention relates to methods and related apparatus for determining by simulation signals in essentially electrical systems. The invention is not limited to electrical systems however. Systems with (partly) mechanical components can be simulated also. The further description focusses further on electrical systems, mainly mixed analog digital circuitry. Simulation methods and simulators are presented which operate on a computer under software control. Said computer simulation methods and simulators are specially suited for simulating digital circuits and mixed analog digital circuits. The methods enable efficient simulation, meaning resulting in a fast simulation while still obtaining accurate results. With fast simulation is meant that the simulation can be completed in a short simulation time. Accurate means that the signals obtained or determined by simulation are good approximations of the signals that would be measured when the circuit, which representation is under simulation, is actually running in real world. Indeed the simulation methods and the related simulation apparatus or simulator exploits a representation of a circuit. Said representation can be entered in text format (in one or another computerlanguage, for instance C++) or in a graphical way. A circuit representation comprises of subcircuits (also denoted blocks or components) and connections between said subcircuits. Said connections carry the signals from one subcircuit to another subcircuit. Therefore it is stated that the signals are located or present on said connections. Alternatively one can state that signals are assigned to connections. Simulation can alternatively be described as a method for simulating a response of a circuit to stimulating signals by using a digital computer executing a computer routine.

In the invention signals are represented as a sum of at least two carriers, each being modulated by a bandpass signal. Said carriers have a different carrier frequency. A carrier can be represented of two signal components with the same frequency. In a first carrier representation said two signal components are a sine and a cosine wave. Both said sine and cosine wave are modulated by said bandpass signal by multiplying said sine and cosine wave signal by signals being representing said bandpass signal. Note that here a complex value bandpass signal, having a real and complex signal part is exploited. It are these real and complex signal part which are used in the multiplication of said sine and cosine wave signals. In a second carrier representation said two signal components are complex exponentials. Both exponentials are modulad by said bandpass signal by multiplying said exponentials by signals being representing said bandpass signal. Here the signal used for multiplying said exponentials are complexe conjugates of each other. Both carrier representations are mathematically equivalent. Note that said bandpass signal is also denoted a complex low pass equivalent signal representation.

In the invention with bandpass signal is meant a signal, which frequency spectra is mainly non-zero valued for a limited continuous range of frequencies, said range is denoted the frequency band of said bandpass signal. The bandwidth of said bandpass signal can be defined as the difference between the upper- and lower bound of said frequency range. Alternative definitions wherein the bandwidth of a signal is defined as the range of frequencies wherein the frequency spectra has values above a certain threshold, said threshold often being defined in relation to the maximal value of said frequency spectra, can also be used. It is an essential feature of the invention that only frequencies within bands are taken into consideration for the simulation, which speeds up simulations. However the invention has enough flexibility due to its flexible signal representations to ensure that still accurate results will be obtained.

A system or subsystem is denoted to be linear when the response at its outputs can be written as a linear combination of its inputs signals. With linear combination is meant a sum of scaled input signals. A system or subsystem is denoted to be nonlinear when no such relation between output and inputs can be written. It must be emphasized that as in physical reality linear systems do not exist, in the invention with linear subsystem is meant substantially linear. The nonlinearities of such subsystem are neglected for further simulation.

In the invention with computation rule for a subsystem is meant an expression used for determining a new value of said subsystems output signal at time instance t based on the previous values of said subsystems input signals at time instance t-Ti, t-nTi with Ti the time step.

In the invention it is recognized that in order to obtain a fast simulation a special type of signal representation is required. Said signal representation must be flexible, meaning adaptable to the requirements posed by the simulation on a signal per signal basis and having sufficient parameters within said signal representation that can be selected to cope with the simulation requirements. One can state that the invention exploits the fact that the overall simulation requirement (accuracy, simulation speed) leads to different local simulation requirements on the signal at each connection. Further the invented simulation method exploits a flexible signal representation for each signal, which is substantially adaptable such that one can cope with such local simulation requirements.

The invention introduces then a computation scheme, being capable to work with said flexible signal representations. Note that the signals attacted to a subcircuit can be labelled as either an input signal or an output signal. It must be emphasized that labelling at the level of a computational graph being a rewritten and potentially modified version of the basic representation of the circuit can also be considered. Said computation scheme works on a time discrete basis, meaning that for each subcircuit (component, block) a rule is used for determining a new value of its output signal at time instance t based on the previous values of its input signals at time instance t-Ti, t-niT, with Ti the time step. It must be emphasized that the invention exploits such computation rule for each subcircuit separately, not only from the viewpoint of the functionality of said subcircuit (which is typically different from subcircuit to subcircuit) but also from the point of view of the time step used in said computation rule. Therefore the time step Ti refers to subcircuit i. The invention does not rely on a general discretisation step T used for simulation of the overall circuit. In the above discussed computation scheme separate execution of said computation rules at a sample-by-sample basis for each subcircuit is possible, but more simulation speed efficient schemes are implemented in the simulation method also. A first approach is to group subcircuits (computation nodes in a computational graph) with the same same computation step are grouped and simultaneously executed. A second approach is to use vector processing for execution of the computation rule of a subcircuit. With vector processing is meant that a plurality of samples is computed. Combination of these approaches is possible also.

The potential difference between time steps used in the computation scheme of connected subcircuit introduces some compatibility problems. The invention deals with this compatibility by introducing down- or upsampling blocks between such subcircuits. It must be emphasized that said down- or upsampling blocks are only added for simulation purposes. With the introduction of said extra blocks for computation one touches another feature of the invention. Indeed introduction of said extra blocks modifies the representation of the circuit under simulation. It is a more general aspect of the invention that starting from a basic representation of the circuit in subcircuits and connections, one modifies said basic representation in order to improve the simulation with respect to speed, accuracy or a combination thereof. Alternatively one can state that the basic representation of the circuit in subcircuits and connections is converted into a computation graph, with computational nodes representing subcircuits and edges representing connections.

The flexible signal representation exploited in the invented simulation method and simulator is a multi-carrier representation, meaning that it can represent signals as a sum of two or more modulated signals, being signals each being modulated around a carrier. Such a multi-carrier representation thus has thus in general a plurality of carriers. A single-carrier representation is a particular case, which can be dealt with by the invented representation also. It is an aspect of the invention that the amount of carriers and the frequencies of said carriers can differ for signals at different connections. The flexible signal representation is further also a multi-rate representation, meaning that the bandwidth of each of the modulated signals can differ from modulated signal to modulated signal within one signal. Note that this kind of flexibility enables the use of different sampling rates for each of the bandpass signals, hence the notion multi-rate is applicable to said signal representation. Naturally even for modulated signals, modulated around the same carrier but at different connections, different bandwidths can be used. Note that the bandwidth of the modulated signals used in the signals on the connections connected to a subcircuit determine the simulation time step for said subcircuit. It is the flexibility of the signal represenation (bandwidth diversity, carrier diversity) that result in a diversity of the time step Ti over the circuit. It is this diversity which enables optimization with respect to simulation step.

The invented simulation method and related simulating apparatus exploits a dataflow description of the circuit under simulation. The circuit to be simulated is essentially described with a feedforward description but means for feedback connection simulation are foreseen also. It is this essentially feedforward characteristic of the description which enables decoupling of the overall circuit equations. One must indeed emphasize that the simulation method performs the simulation in a sort of distributed fashion. No equations describing the overall circuit dynamics must be solved. Instead components-wise a computation rule is evaluated. The evaluation frequency is individual for each component or subcircuit. Note that the components or subcircuits or nodes used throughout the simulation can differ from the initial representation of the circuit due to graph rewriting, meaning rewritting of the computational graph.

Figure 24:
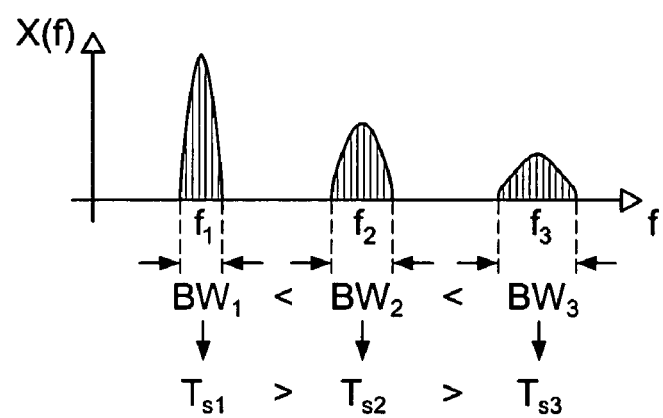
FIG. 24: is a spectral representation of an MRMC signal.

The basis of the flexible multi-rate multi-carrier (MRMC) representation in the simulation method is the complex lowpass equivalent representation of a signal With this representation a bandpass signal x(t) centered around a frequency f with amplitude and phase modulation has the form $x(t)=x_L(t) \exp(j\ 2\pi f\ t)+x_L^*(t) \exp(-j\ 2\pi f\ t)$, in which $x_L(t)$ is the complex lowpass signal representation of x(t). The complex lowpass representation only models one carrier. A practical signal often consists of different bandpass signals, e.g. the modulated carrier of interest and its (modulated) harmonics, or an interfering signal. These out-of-band signals can cause in-band distortion due to nonlinear behavior of the circuit under simulation, for instance, a front-end block. In the invented signal representation these out-of-band signals can be taken into account. To this purpose, a signal x(t) is considered as being composed of different bandpass signals, which are all represented by a complex lowpass representation $x_{L,i}(t)$: $x(t)=\frac{1}{2} \Sigma_i [x_{K,i}(t) \exp(j\ 2\pi f_i t)+x_{L,i}^*(t) \exp(-j\ 2\pi f_i t)](2)$. Here, $f_i$ is the center frequency of the bandpass signal represented by $x_{L,i}(t)$. Hence, $f_i$ represents the carrier frequency if $x_{L,i}(t)$ represents the modulation of a carrier. Each $x_{L,i}(t)$ is represented as a discrete-time signal with a different timestep $T_{s,i}$ that is large enough such that $x_{L,i}(t)$ is represented without aliasing (see FIG. 24).

When an MRMC signal is fed into a nonlinearity, then extra modulated carriers are generated. However, not all of these carriers are equally important. Several bands or sub-bands can be neglected since they will finally not yield a significant contribution to the in-band distortion when they are fed into a subsequent nonlinearity. The simulation method can neglect unimportant frequency bands by using information of a short test simulation with a limited number of input samples. This test simulation does not use yet the MRMC representation. At the different places (connections) in the circuit to be simulated the waveforms computed in this test simulation are inspected and the modulated carriers which are smaller than a user-specified threshold are indicated to be negligible in the final simulation. Also, from this simulation the carrier frequency of each non-negligible modulated carrier is determined, together with the bandwidth of its complex lowpass representation. Further, the total number of carriers can be reduced by combining bandpass signals that are sufficiently close to each other. It can be stated that in the simulation method one can recognize a step wherein the signal representation at the connections are selected (carrier positions, bandwidths) based on either a test procedure or based on the information one wants to extract from the simulation or based on in-depth knowledge about the circuit under simulation or based on considerations about the simulation efficiency or a combination thereof.

When computing the output of a subcircuit or block described by a linear transfer function, the method processes the different components of an MRMC signal individually. The method can thus be understood as a method wherein for a linear subcircuit in the representation of the circuit under simulation a plurality of computational nodes are foreseen in the computational graph, one for each different component of the flexible signal representation. Nonlinear blocks, however, combine the different bands of the MRMC signal to produce their output. To compute the output correctly, the timesteps for the different components of the MRMC signal are first made equal to a common timestep $T_{common}$ that is small enough to represent the widest band in the complete output signal without aliasing. This is accomplished by an interpolation operation. After the computation of the output signal with one single timestep, a MRMC representation is constructed from this signal. Changes in the timestep that are required in this construction are realized by the insertion of decimators and/or interpolators, also denoted up- and down sampling blocks. The invention has different methods to compute the output of a nonlinear block, namely the combinatorial approach and the Fourier-transform-based approach. The type of nonlinearity (weak, strong) and the number of components in the MRMC signal determine which method is the most efficient. In the invention weak dynamic nonlinearities can be modelled as linear transfer functions and static nonlinearities. Note that thus again a sort of preparation step can be identified within the simulation method. Said preparation step selects an appropriate signal representation. Further again graph rewrite steps, such as the insertion of decimators and the replacement of weak dynamic nonlinearities by linear dynamics and static nonlinearities, is recognized.

In the invention a combinatorial approach can be used for computation of the response of a nonlinear subcircuit. For a small number of carriers that is fed into a nonlinearity of a low degree, the output of the nonlinearity can be computed by raising the sum of carriers, as given in equation (2), to the appropriate power and consider the different terms, each of which considers to a contribution to a carrier at some frequency. For example, assume that an MRMC signal with n carriers is fed into a static nonlinearity of degree m, namely $x^m$, then the output of this nonlinearity contains terms of the form $$\prod_{i=1}^{n} K_{k_i,l_i} [(x_{Li}(t))^{k_i} \cdot (x_{Li}^*(t))^{l_i} \cdot \exp(j2\pi(k_i - l_i) \cdot f_i \cdot t)] \quad (3)$$

and the complex conjugate term at the corresponding negative frequency. In this equation the indices $k_i$, $l_i$ are non-negative such that $$\Sigma_i (k_i l_i) = m \quad (4)$$

Further, the integer coefficient $K_{ki,li}$ is precomputed. From (3) it is seen that the modulation of the carrier at the frequency $(k_i-l_i)f_1 + \ldots + (k_i-l_i)f_n$ can be computed by multiplying complex baseband signals or their complex conjugate. This approach is only feasible for a small number of carriers and a low degree of the nonlinearity since the number of contributions that need to be considered at each output carrier increases exponentially with the number of carriers and the degree of nonlinearity.

In the invention also a Fourier transform approach can be used for computation of the response of a nonlinear subcircuit. In a signal that consists of several modulated carriers, such as the one given in equation (2), each carrier can be represented by a high-frequency sinusoidal signal with a slowly varying amplitude and phase. At each discrete timepoint $t_p = p \cdot T_{common}$ the set of modulations $x_{L1}(t_p), \ldots, x_{Ln}(t_p)$ on the carriers are used to compute a time-domain representation of the quickly varying part of the signal, assuming that the carriers are not modulated. This time-domain representation is further in the text designated as an equivalent time-domain representation in order to make a distinction with the time-domain representation of the complex lowpass signals. The equivalent time-domain representation is computed by first taking an inverse discrete Fourier transform (IDFT) at each timepoint $t_p$. Next, a static nonlinearity can be applied to each individual equivalent time domain sample. Finally, the modulation on the different carriers at the output of the nonlinearity is computed by taking a DFT of the equivalent time-domain representation of the output of the nonlinearity. Notice that in contrast with the previous method, this approach can also be used for strong nonlinearities.

When the number of carriers at the input of the nonlinearity or the number of carriers of interest at the output is large, then in the invented simulation method one replaces the IDFT and the DFT by an IFFT and an FFT, respectively. Note that the simulation method is constructed such that based on the circuit under simulation an appropriate computation method is invoked, being either based on the combinatoric approach, a first Fourier transform technique with DFT's, IDFT's or a second Fourier transform technique with FFT, IFFT's. The selection of the computation method can be for each subcircuit within the circuit being different.

In the invention a computational graph is constructed from the basic representation of the circuit to be simulated. Before the actual simulation, a translation of the basic representation, for instance a C++ description of the circuit, for instance a front-end architecture, into a so-called computational graph is performed. The vertices of this directed graph are referred to as computational nodes. They represent functions that operate on data and return data. Examples are: an FIR filter, an IIR filter, a static nonlinearity, a summer, an (I)FFT block, a (I)DFT block, a convolution block, a quantizer, an interpolator, a decimator, different types of generator blocks (e.g. a Gaussian noise generator, a waveform generator (A waveform generator reads data from a table that contains the input data as a function of time and sends these data to its output), . . . The directed edges of the computational graph represent the data that is exchanged between the blocks using buffers. The optimal buffer sizes are determined during the construction of the graph. Every block gives rise to one or more nodes in the computational graph, the actual number of nodes depending on the number of carriers, the carrier frequencies and the sampling frequencies of the MRMC input and output signals of the block. For example, a block described by a linear transfer function and with n carriers at its input is translated into n parallel IIR or FIR filters, each with a complex transfer function. The translation step further generates the interpolators and decimators that perform the changes of the timesteps. An automatic graph generation step that precedes the scheduling and the computations is implemented.

After the setup of the computational graph, the computations are scheduled and executed. During execution, the different computational nodes perform vector processing as much as possible. In this way, the architecture of processor used for simulation is exploited optimally. Further, the execution scheme is flexible such that both synchronous and asynchronous nodes can be included. An example of the use of asynchronous nodes is the situation where the clock frequency of a digital part and the frequencies of the continuous-time blocks are incommensurate. A dynamic dataflow execution scheme has been chosen as the fundamental execution scheme. Groups of synchronous nodes—i.e. nodes that can be scheduled prior to the execution—are introduced as a subset of this dynamic execution scheme to increase the computational efficiency. The buffers in between the nodes operate in a blocking input/blocking output mode. This ensures that the amount of memory used remains fixed, in contrast with other methods such as blocking input/non-blocking output, where one needs to take special precautions to guarantee that the amount of memory used remains limited. In order to make vector processing possible, it is necessary that the buffers in between the nodes can contain a sufficient number of tokens. Careful management of the buffers makes it possible to read and write directly into these buffers without additional data movement. Feedforward parts of an architecture are computed with vector processing whereas feedback loops are computed on a sample-by-sample basis. The scheduler automatically switches the calculations between vector and sample-by-sample processing. Introducing vector processing in a dynamic way is done using a scheduler which is built around a priority queue with four levels of priority: (1) nodes that are not ready for execution, (2) nodes not in a feedback loop and ready for sample-by-sample execution, (3) nodes in a feedback loop and ready for sample-by-sample execution, (4) nodes ready for vector processing. Every node is marked in advance whether it is in a feedback loop or not. This information—together with the number of input tokens and the number of free output tokens—is used when determining the priority level of the node. Executing the node with the highest priority guarantees that vector processing will be used as much as possible. Nodes outside a feedback loop either wait until vector processing is possible or no nodes in any feedback loop can be executed.

The use of a flexible signal represenation in the simulation method can be formalized as follows:

A method for simulating signals of a circuit, comprising of subcircuits and connections, said signals being located on said connections, said method being characterized in that at least one of said signals being represented by a sum of at least two carriers, each being modulated by a bandpass signal, wherein at least two of said bandpass signals having a different bandwidth.

A method for simulating signals of a circuit, comprising of subcircuits and connections, said signals being located on said connections, said method being characterized in that at least two of said signals being represented by a sum of at least two carriers, each being modulated by a bandpass signal, wherein at least two of said signals having a representation being different from signal to signal in either at least one carrier frequency or in at least one bandwidth for a carrier frequency common for said two signals.

Note that the signal representation recognizes that the number of frequency bands of interest in an analog signal is not necessary restricted to one. In order to represent the analog signals in a numerically efficient way, a multi-rate multi-carrier representation is used. This implies that analog signals are built out of one or more equivalent low-pass signals centered around different center frequencies, zero included. All equivalent low-pass signals can be simulated at different sampling rates. This representation combines the strength of equivalent low-pass signals (e.g. simulation around a carrier) with the possibility of simulating multi-carriers (e.g. simulation of the harmonics of a carrier) and the fact that the bandwidth of interest may change in the simulation circuit (e.g. the bandwidths of an oscillator, the IF signal and the input of a spread spectrum receiver differ significantly). Alternatively the method can be formulated as:

A method for determining signals of a circuit, comprising of subcircuits and connections, said signals being located on said connections, said method being characterized in that at least one of said signals being represented by at least two complex low pass equivalent carriers, each of said complex low pass equivalent carriers being characterized by a carrier frequency and their complex modulations, said complex modulations being represented by their bandwidth, at least two of said complex low pass equivalent carriers having a different bandwidth; and determining said signals of said circuit by determining at least two of said complex modulations.

In the method recited above one can further specify that said determining of each of said complex modulations is successively in time with a time step related to the bandwidth of said complex modulations. Another formulation is as follows:

A method for determining signals of a circuit, comprising of subcircuits and connections, said signals being located on said connections, said method being characterized in that: at least two of said signals being represented by at least two complex low pass equivalent carriers, each of said complex low pass equivalent carriers being characterized by a carrier frequency and their complex modulations, said complex modulations being represented by their bandwidth, at least two of said signals having a representation being different from signal to signal in either at least one carrier frequency or in at least one bandwidth for a carrier frequency common for said two signals and determining said signals of said circuit by determining at least two of said complex modulations.

Again one can state that in the method recited above that said determining of each of said complex modulations is successively in time with a time step related to the bandwidth of said complex modulations.

Known analog signals representations and their limitations are described first. In the invention the limitations of such known analog signal representations are solved by using a local multi-carrier multi-rate representation. The representation of the different frequency bands required for this representation can be extracted either manually or through performing a preprocessing wherein a short simulation is performed.

Figure 3:
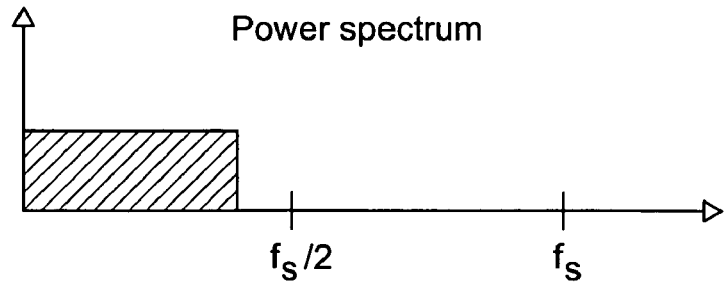
FIG. 3 shows bandpass and equivalent low pass representations of signals.
Figure 3:
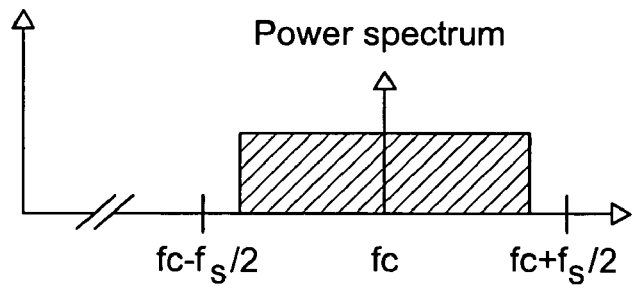

Analog signals S(t) are most often represented using either a sampled representation of the analog waveform s(k). This is often done using either a bandpass or an equivalent low-pass representation. The sampling period must fulfill the Nyquist criterion in both cases (FIG. 3).

Figure 4:
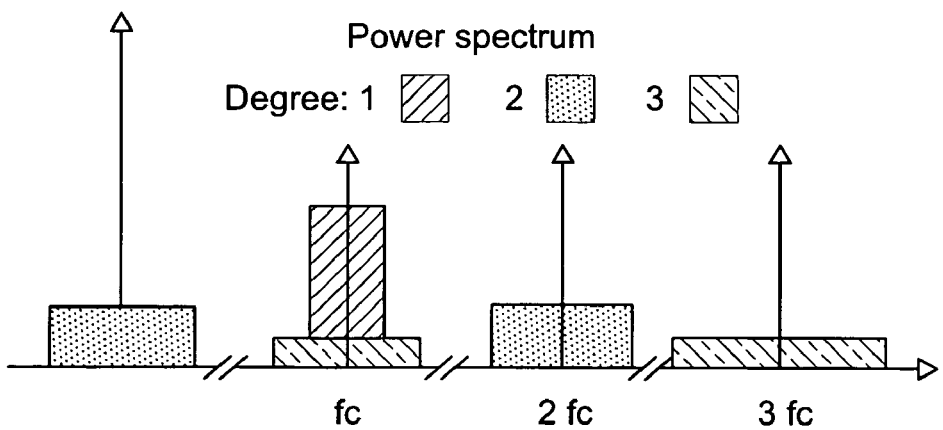
FIG. 4 shows the power spectrum of the nonlinearity in a device.

In equivalent low-pass representation, one samples the complex envelope $s(t)= re(t)+j*im(t)$ where the signal S(t) satisfies $S(t)=re(t)*cos(2*pi*fc*t)+im(t)*sin(2*pi*fc*t)$. The main drawback of this representation comes from the fact that harmonics of an equivalent low-pass signal around fc can not be represented. To illustrate this, consider in FIG. 4, the power spectrum of a single carrier modulated signal around fc which passes through a nonlinear device of the third degree. When using an equivalent low-pass representation around fc, then it is possible to take the nonlinear distortion of the 3rd degree into account. If, however, the next stage in the circuit also has a second-degree nonlinearity, then both second-degree nonlinearities will combine into a third degree nonlinearity. Neglecting the signal around 2*fc can therefore be a source of simulation errors.

The envelope simulator of HP is capable of representing multi-carrier signals. The envelope simulator is basically a harmonic balance simulator which is adapted such that the harmonic balance method can handle the transients coming from the time-varying aspects of the modulation. The main disadvantage of this simulator is that the signal representation is not local.

A carrier frequency fc required by one analog signal will also be used by all the other analog signals. This implies that although a carrier frequency is required only locally (e.g. around the high frequency carrier), the simulator will take this carrier into account in the rest of the system (e.g. in the IF part of the system).

The sampling rate to represent the carriers is common to all signals. This comes from the fact that in each step a harmonic balance is performed and that a kind of integration method is used to calculated the transients in between the harmonic balance steps. This can lead to very inefficient simulations if large changes in bandwidth are involved. This is especially the case for spread spectrum applications.

In the invention a local Multi-rate Multi-carrier representation is presented. A sum of equivalent low-pass signals is used to represent an analog signal.

$$S(t)=\text{sum}_i[re_i(t)*cos(2*pi*fc_i*t)+im_i(t)*sin(2*pi*fc_i*t)]$$

Figure 5:
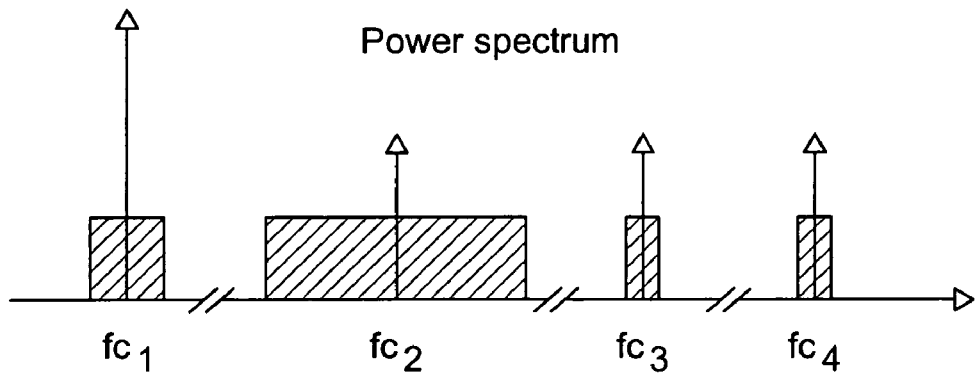
FIG. 5 shows the signal representation comprising at least two complex low pass equivalent carriers, whereby at least two bandwidth of said carriers with different band widths.

This makes it possible to represent multi-carrier signals using the complex envelopes $s_i(t)=re_i(t)+j*im_i(t)$ around the carriers $fc_i$. If the different frequency bands have different bandwidths, it is possible to use different sampling rates for the different equivalent low-pass representations as depicted in FIG. 5.

The motivation of working with frequency bands comes from the fact that frequency bands are relevant specifications for analog signals. Carrier frequencies and sampling rates, on the other hand, are only artifacts of the simulators. Predicting which frequency bands are of interest during simulation is a non-trivial problem. The main problem is that non-linear effects will increase the bandwidths, thereby leading to very conservative settings. To solve this problem, it is necessary to specify the frequency bands of the signals either manually or through simulations. Specifying the frequency bands of an analog connection will result in code that provides the necessary conversions to obtain the required frequency bandwidth.

In order to set the frequency bands in a manual way, several tools are provided in the invention in order to ease this process. These tools include the union/intersection/difference of sets of frequency bands and the convolution of different frequency bands. The latter can be used to compute the effect of non-linear devices.

Figure 6:
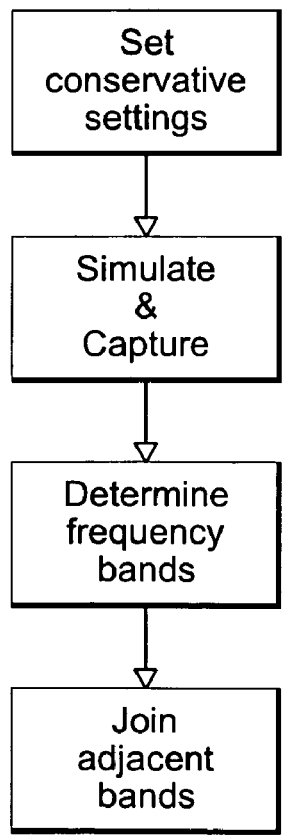
FIG. 6 is a flowgraph of the frequency extraction algorithm.

Specifying the frequency bands manually can be very involved when dealing with complex systems. Using Volterra theory to compute the different degree of contributions can provide an alternative. This method still leads to conservative specifications for the frequency bands since Volterra theory does not take the amplitude of the signals into account. Therefore, following scheme (FIG. 6) is proposed to extract the frequency bands of interest of an analog signal.

Frequency band extraction algorithm
1. Set conservative settings:
   Specifies conservative frequency bands to remove all simulation errors due to the aliasing
2. Simulate and capture:
   Perform a short simulation run with inputs signals that are representative for the full-blown simulation. During this short simulation, the power spectra of the analog signals on the analog connections are captured.
3. Determine the frequency bands:
   Determine the contributing frequency bands using the power spectra of the analog signals and a threshold which is specified by the user. All signal power below this threshold will be considered as negligible.
4. Join adjacent frequency band:
   It might occur that the frequency spacing between 2 frequency bands is small compared with the bandwidth. In that case, it is advisable to join the adjacent frequency bands into 1 larger frequency band.

Note that the circuit under simulation can be represented by the following subcircuits: analog ports, being characterized by its Norton equivalent, its Thevenin equivalent or its S-parameters; digital ports, being configured as either input or digital output; and clock ports, being configured as source or sink of a series of time stamps. Within said circuit the following connections can be found;

analog connections; digital connections; and clock connections.

The invention deals with determining of signals in mixed signal systems. Said mixed signals systems are represented by subcircuits being analog ports, analog connections, digital ports, digital connections, clock ports and clock connections.

A analog port is characterized by its Norton equivalent. Alternative representations—such as Thevenin equivalent or S-parameters for microwave devices—are also possible but need an additional translation step during graph generation. The Norton equivalent of the circuit is described using a frequency dependent admittance and a current source. The frequency dependent admittances are described by a frequency response function. The current sources can depend on all voltages over all ports of the circuit. These voltages over the ports are described by the analog connections using analog signals.

An analog connection interconnects several analog ports. An analog connection can be interpreted as a parallel circuit of the different Norton equivalent circuits of the different ports. Hence, loading the output of one circuit by the input of another can be described easily.

A digital port can be configured as either input or digital output. An output port specifies the fixed point representation (number of bits, rounding, saturation) used and has an optional tri-state mode. An input port only has a fixed-point representation.

A digital connection interconnects digital output ports. All digital ports need, however, identical fixed-point representations. The digital signal of a digital connection can only be modified by an output port which is not high impudent and a digital connection can only be reed by the input ports. If more than one output port is active during simulation—not high impudent—then a warning is thrown.

A clock port can be configured as source or sink of a series of time stamps. Such clock signals is of particular importance in devices which depends on time signals such as e.g. triggering circuits, track-and-hold/sample-and-hold circuits . . . The (input) clock port of e.g. a track-and-hold will then receive the time instances where the track-and-hold switches state. This enables the simulation of e.g. timing jitter in the sampling clock.

A clock connection interconnects a single clock port that is configured as a source with one or more clock ports that are configured as sinks. The clock signal of a clock connection can only be modified by the output port and can be reed by all input ports.

In a more general setting the construction of a computational graph of the (mixed signal) circuit or system is represented as a method for transforming a first graph (or basic representation of the circuit) into a second graph (computational graph) by applying graph rewrite rules, thereby optimizing the determination of signals of said mixed signal system, mainly in order to increase the simulation speed. This aspect of the invention can be formalized as follows:

A method for determining signals of a circuit, comprising of subcircuits and connections, said signals being located on said connections, comprising the steps: representing said circuit as a first graph, comprising nodes and edges, at least part of said nodes representing said subcircuits and at least part of said edges (vertices), representing said connections, said signals having related signals on said edges; determining in said first graph at least one subgraph; transforming said first graph into a second graph by replacing at least one subgraph of said first graph by another subgraph following a rewrite rule; and determining said signals of said circuit by determining said related signals on said edges of said second graph. Said rewrite rules for replacing one subgraph by another subgraph are selected for a set of rewrite rules. Said selection of a rewrite rule is adapted for optimizing said determining of said related signals on said edges of said second graph, mainly with respect to simulation speed. An example is the introduction of extra nodes in case of linear systems with multi-carrier inputs. Another example is the addition of decimators and interpolators (also denoted up- and downsampling nodes).

The directed graphs used as computational graph uses node descriptions where each node S has a fixed number of result variables and a fixed number of argument variables. All nodes contain context information of how to compute the response of the nodes. This context differs with the type of node.

The node specification is given by an equation n=S(m) with
n: a list of result variables
m: the list of argument variables Every node, S, specifies the dependency of the result variables, n, based on the argument variables, m, according to the type and the context of S.

Different variable types are considered. Each type has its proper attributes which describes the properties. The different types can be split into 2 groups, namely the composite and the concrete variables.

Composite variables are intended to group variables. Examples are given below.
   Representation for an analog signal which specifies the frequency bands of the analog signal. It also contains reference(s) towards the baseband signals (BaseBandSignal) and the equivalent low-pass signals (EquiLowpassSignal) used during simulation.
   AnalogSignalList
       Representation of a list of analog signals (AnalogSignal)
   DigitalSignalList
       Representation of a list of digital signals (DigitalSignal)

Examples of concrete variables are:
   DigitalSignal
       Representation for a digital signal. Specifies the finite word length representation.
   ClockSignal
       Representation for a sequence of time instances.
   BaseBandSignal
       Baseband representation for an analog signal, specified by the sampling frequency.
   EquiLowpassSignal
       Equivalent low-pass representation for an analog signal specified by the sampling frequency and the carrier frequency.

A graph is defined as a set of node specifications G. The node set of g is represented by N(g). V(g) represents the variable set of g. The specification of G consist out of the declaration of
   the variables set of g: V(g)
   the node set N(g) in order to specify the context and the class of each node
   the vertices between the nodes using the variable set V(g)

Figure 7:
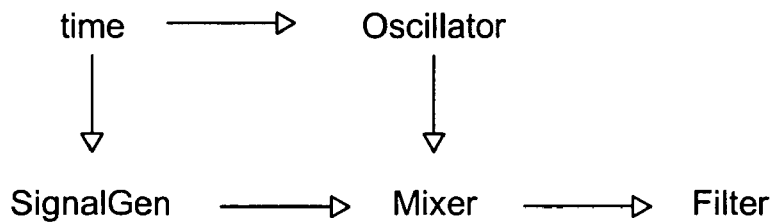
FIG. 7 shows an example of a graph.

An example of a graph, g, is shown in FIG. 7. In code the graph can be denoted by
   <// Declaration of the free variables
   ClockSignal time;
   AnalogSignal in, osc, mixerOut, filterOut;
   // Declaration of the node class
   AnalogSineGenerator Oscillator;
   AnalogSignalGenerator SignalGen;
   AnalogMixer Mixer;
   AnalogFilter Filter;
   //Specifying the vertices
   in=SignalGen(time);
   osc=Oscillator(time);
   mixerOut=Mixer(in, osc);
   filterOut=Filter(mixerOut); >

Graph rewrite rules are used to rewrite one (sub)graph into another (sub)graph. Rewriting a graph can only be performed if a match is found between the (sub)graph and the condition-part of the rewrite rule. If such match is found, the action-part of the rewrite rule is executed in order to rewrite the original (sub)graph into a new (sub)graph.

A graph rewrite rule R=(g>>h) consists of left-hand side graph g—which specifies the condition-part—and a right-hand side graph h—which represents the action-part. The condition-part might include constraints on the graph g.

Consider the rewrite rule that joins 2 cascade linear systems, H1 and H2, into one linear system, H. Hence, R=(g>>h) can be written as
   g=<AnalogSignal x, y, z;
   AnalogLinearFilter H1, H2;
   y=H1(x);
   z=H2(y); >
   h=<AnalogSignal x(g.x), y(g.y), z(g.z);
   AnalogLinearFilter H(cascade(g.H1, g.H2));
   z=H(x); >

Figure 8:
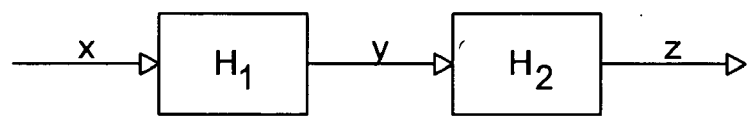
FIG. 8 represents a potential rewrite rule for a cascade of subsystems.
Figure 8:
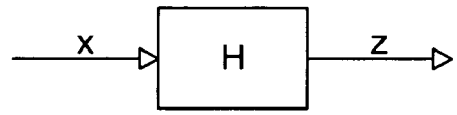

This can be represented graphically as in FIG. 8.

Figure 9:
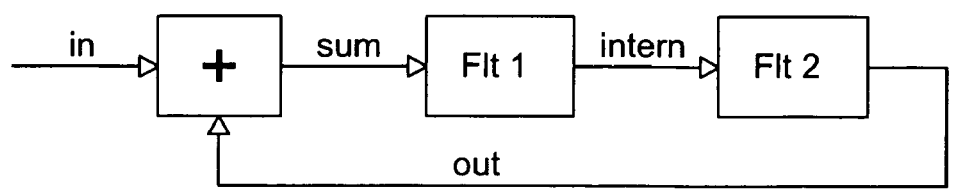
FIG. 9 represents a system on which a rewrite rule will be applied.

A match is a mapping from a graph f to a graph g such that
   the variable set V(f) can be mapped onto variables of the same type in V(g)
   the node set N(f) can be mapped onto nodes of the same type in N(g)
   conditions on the graph f are satisfied Consider the graph, f, representing linear feedback loop in FIG. 9. This loop can be described as follows.
   f=<AnalogSignal in, sum, intern, out;
   AnalogAdder Add;
   AnalogLinearFilter Flt1, Flt2;
   sum=Add(in, out);
   intern=Flt1(sum);
   out=Flt2(intern); >

Figure 10:
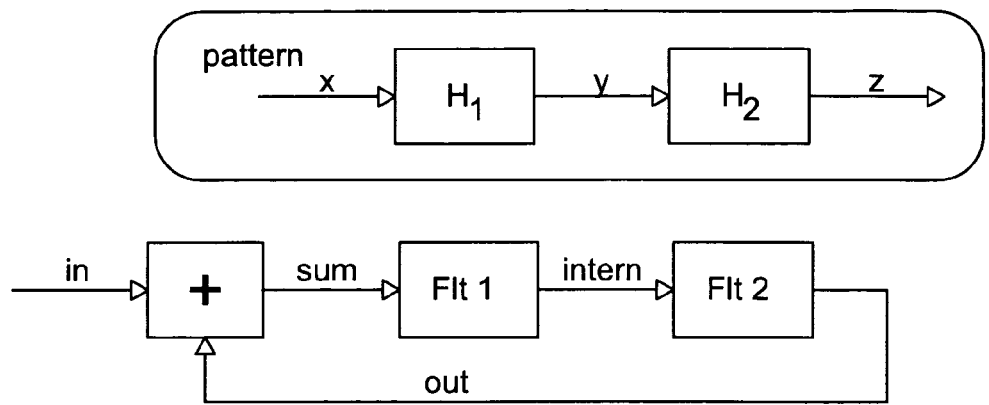
FIG. 10 represents the execution of a rewrite rule, comprising a condition to be evaluated (pattern matching) and an action part.

Consider the rewrite rule given in the rewrite rule example. Then the match of FIG. 10 is obtained.

| graph f | Sum | intern | Out | Flt1 | Flt2 |
| graph g | X | y | Z | H1 | H2 |

A (sub)graph f can be rewritten according to rule R=(g>>h) if R is applicable to the graph f, i.e. if the condition-part of R matches the (sub)graph f. If so, then the action-part is executed and generates the graph h.
   1. The graph is extended with an instance of the graph h.
   2. The match determines the connections from the graph h with the original graph. All references are redirected from the graph g to graph h.
   3. All 'unreachable nodes' are removed.

Figure 11:
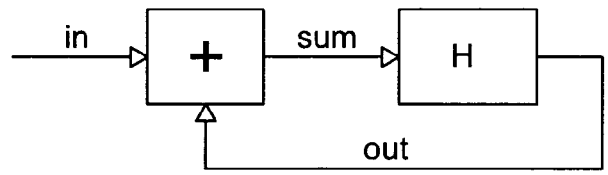
FIG. 11 shows the result of applying a rewrite rule on the system of FIG. 9.

Consider the rewrite rule example and the match example. Applying this rewrite rule results into the graph of FIG. 11
   <AnalogSignal in, sum out;
   AnalogAdder Add;
   AnalogLinearFilter H;
   sum=Add(in, out);
   out=H(sum); > where H represents an analog system that is the cascade of Fit1 and Flt2.

The description of the different systems and signals are such that only physically relevant quantities are specified. The main purpose of the compiler is to compile these specifications into a dataflow graph. This compilation uses graph theory and graph rewrite rules. The compilation is performed in different stages.
   1. Graph Generation: translates the system and signal descriptions into a graph where each node corresponds with a basic simulation block (e.g. an analog multiplier, an analog filter).

2. Graph Decoration: determines the signal specifications of signals that are internal or not specified by the user.

3. Graph Optimization: applies rewrite rules on the graph to optimize the graph with respect to simulation speed.

4. Code Generation: produces virtual execution code to perform the system simulates.

The generation of the graph depends on both the descriptions of the different sub-systems and the interconnections between these sub-systems. A sub-system is translated into a sub-graph which represents the way the output is computed given the inputs. The connections between the different sub-systems are also represented using a graph. After the graph generation, a semantic check is performed to verify whether all nodes and variables have sufficient information for further processing the graph.

The appropriate graph is generated depending on the specified sub-system. The specified system parameters are used to parameterize the nodes of the graph.

Consider an analog mixer characterized by
- a (frequency independent) conversion gain (represented by conversionGain)
- a frequency dependent, linear LO-IF isolation (represented by H1)
- a frequency dependent, linear RF-IF isolation (represented by H2)

Figure 12:
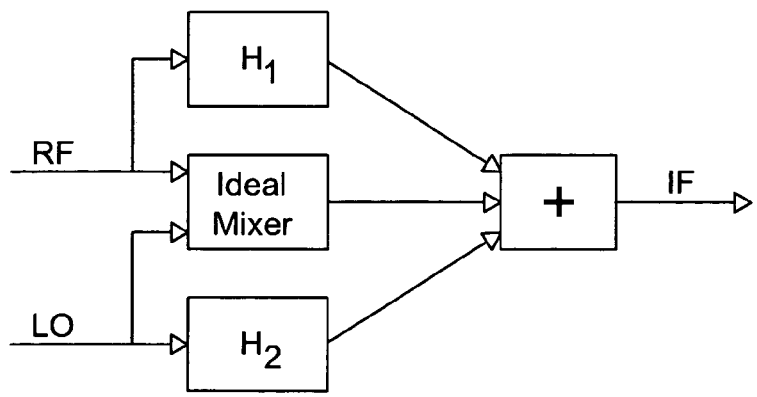
FIG. 12 shows as an example an analog mixer as system under consideration for simulation.

Such system can be modeled using the graph of FIG. 12, which can be represented as <AnalogSignal IF, RF, LO, mixingOut, isolationRFIF, isolationLOIF;
AnalogAdder Add;
AnalogLinearFilter H1, H2;
AnalogIdealMixer Mixer(conversionGain);
isolationRFIF=H1(RF);
isolationLOIF=H2(LO);
mixingOut=Mixer(RF, LO);
IF=Add(mixingOut, isolationRFIF, isolationLOIF); >

The generation of the graph allocations the required variables. Depending on the type of port/connection, different translation strategies and parameterizations are used. One variable of the type DigitalSignal is allocated for every digital output port. One variable of the type ClockSignal is allocated for every clock output port.

Analog connections need to take into account the impedance loading of interconnected circuits. To do so, analog signal representations are assigned to both the analog ports and the analog connections. The variables assigned to the analog ports represent the voltage dependent current sources of the Norton equivalent of the ports. The variables associated with the analog connections represent the voltages over the connections.

Figure 13:
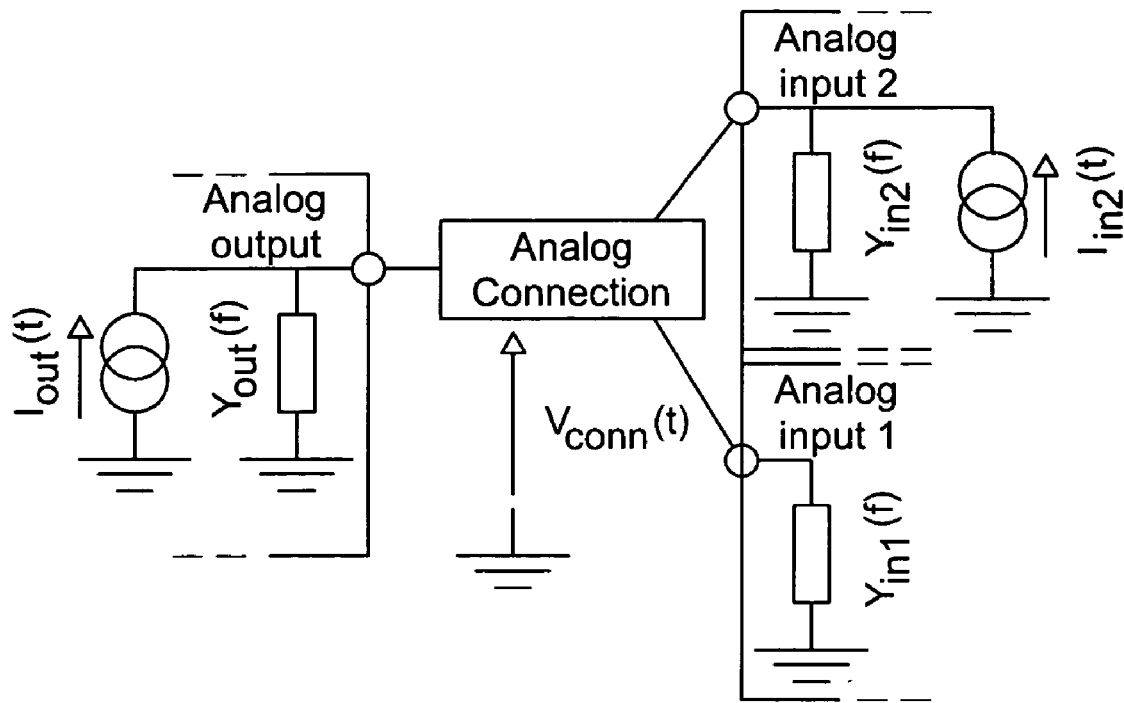
FIG. 13 shows once more the representation of a mixed signal system as a connection of blocks, whereby the modeling of the connection is explicitly shown.

Consider the example of FIG. 13.

Figure 14:
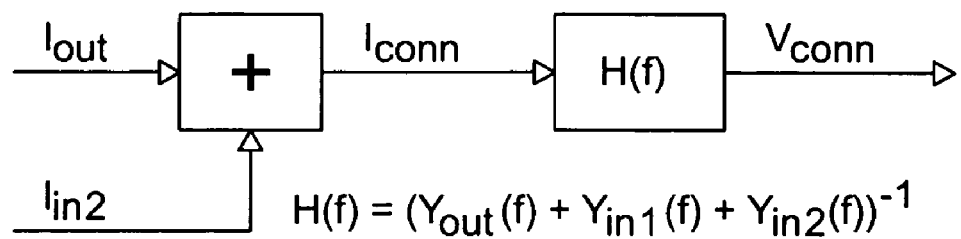
FIG. 14 shows the graph representation for the system of FIG. 13.

This implies that the connection can be expanded using the graph of FIG. 14.

This can be expressed as

<AnalogSignal Vconn, V, Iconn, Iout, Iin2;
AnalogAdder Add;
AnalogLinearFilter H(Yout+Yin1+Yin2);
Iconn=Add(Iout, Iin2);
Vconn=H(Iconn)>

Figure 15:
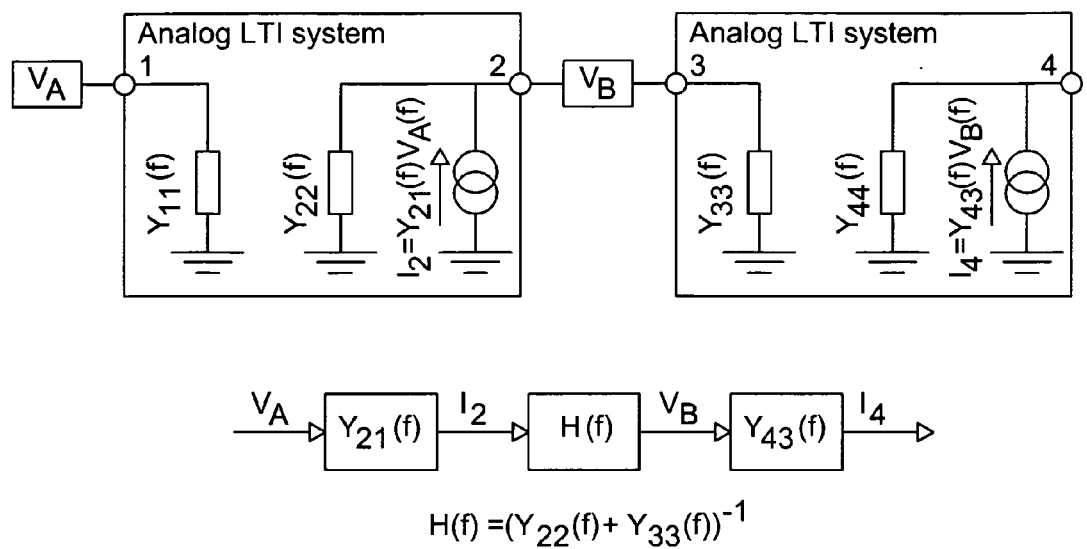
FIG. 15 shows the expanding of a cascade of two linear systems and shows the graph representation of the system of FIG. 14.

Cascading 2 linear time invariant systems (characterized using a frequency response function H1 and H2) produces the graph of FIG. 15.

A semantic check determines whether all information and parameters are available in both the nodes and the variables. This implies that
- each node has enough information to generate the virtual code
- it is possible to compute the frequency bands required for all analog signals starting from the specification of the different nodes and specifications on the connection.

The graph will not be changed during this check.

The graph generated using the system description specifies the parameters of the different nodes of the graph. The description of the signals can, however, be incomplete since the user does not specify the parameters of all—possibly internal—signals in the graph. Completing the signal parameters is done by computing the properties of output signals of those nodes whose inputs are completely specified. Successively application of this technique to the different nodes leads to a fully decorated graph. This operation is always possible since the system graph is semantically correct.

Only those nodes whose inputs are complete specified are considered for decoration. The decoration uses the input specifications to generate the output signals that are appropriate for the node under consideration. The specification of the output(s) of this node can be the input(s) of another node, making this node a possible candidate for decoration. There is only one constraint on the analog output signal: the set of frequency bands need to be such that adjacent channels are not to close to each other and that they do not overlap. This is done by inserting—if necessary—an additional node that merges adjacent/overlapping frequency bands. How the different nodes of the graph are decorated depends on the type of node.

The output spectrum of an independent analog source dependents only on the type and specifications of the source. Hence, the output signal of an independent analog source can always be decorated. It is well known that the input and the output signals have identical frequency bands. The response of the filter will be computed during simulation by a real or a complex filter in the z-domain for respectively baseband and equivalent low-pass signals.

Figure 16:
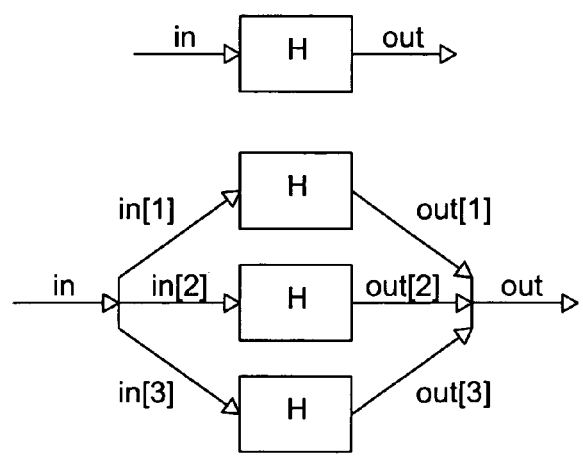
FIG. 16 shows a representation for a system, wherein 3 frequencies are used for modeling the signals.

Consider an analog linear filter H (FIG. 16), with an analog input, in, and an analog input, out, which consists out of 3 frequency bands. The i-th frequency band is accessed using in[i], out[i]. Note that the equivalent z-domain filter of the analog linear system is not computed yet. Only a reference to the filter description H is kept.

Using the Volterra theory [Schetzen M., "The Volterra and Wiener Theories of Nonlinear Systems", John Wiley & Sons, New York, 1980.], it is possible to compute the frequency bands that are generated by a polynomial nonlinearity starting from the input frequency bands. This makes it possible to compute the output frequency bands starting from an arbitrary analog input signal. In order to compute the response of an analog polynomial nonlinearity correctly, it is required to
- convert all the basebands and equivalent low-pass signals of the analog signals towards 1 sampling frequency, namely the largest sampling frequency.
- increase the sampling rate to overcome aliasing in the output signal.

Consider an analog multiplier which multiplies the analog signals x and y to produce z. For simplicity, consider that
- both x and y have one frequency band with the same carrier frequency, $f_c$
- the bandwidth of x is twice the bandwidth of y.

Figure 17:
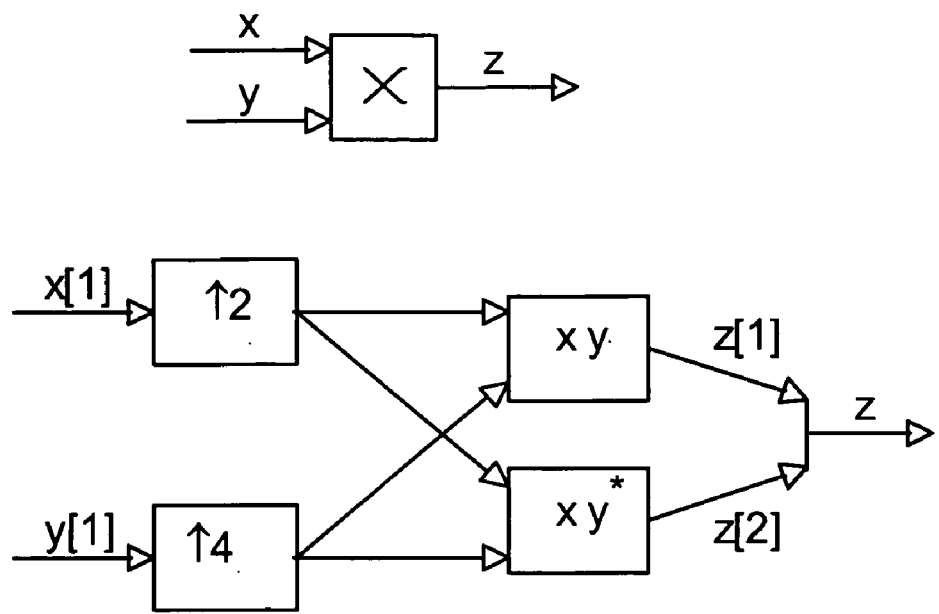
FIG. 17 show a representation of a mixer signal. The appropriate frequency up-conversions are shown.

In that case the conversion of x, represented by ConvX, will consist out of an interpolation by a factor 2, while y requires a conversion, represented by ConvY, which equals an interpolation by a factor 4. Afterwards, the intermodulation of the products x y and x y* are calculated. This can be represented graphically as in FIG. 17.

The variable z[1] represents an equivalent low-pass equivalent signal with carrier frequency $2 f_c$. The variable z[2] represents the baseband signal.

A frequency band converter is used to convert the sampling rate/carrier frequency from the input signal towards the output signals. A converter first performs a mapping between the input spectra and the output spectra in order to known which input frequency band(s) contribute(s) to which output frequency band(s). The necessary carrier frequency conversions and sample rate conversions are determined and written as a graph.

Merging adjacent/overlapping frequency bands requires operations that are similar to the operations of the frequency band converters. First, it determines which frequency bands should be merged. Afterwards, the necessary carrier frequency conversions and sample rate conversions are computed and written as a graph. This reduces the number of frequency bands that are close to each other, thereby reducing the computational overhead.

A set of optimization rewrite rules is applied to the graph to optimize the simulation speed. The basic optimization rules basically try to remove unused signals remove operations that perform a no-operation group common operations A special set of optimization rules tries to rewrite graphs that consist of linear filters and sample rate converters only. This includes following optimizations:

swapping the linear systems and the sample rate converters such that the linear systems are simulated at the lowest possible sampling rate grouping sums and cascades of linear systems elimination of linear feedback The latter implies that a closed loop simulation problem of linear systems is converted into a feedforward system. This can increase the computation speed significantly when using block processing to compute the response of the feedforward system. Nonlinear feedback loops can not be rewritten in a feedforward manner, thereby making block processing impossible. If a zero-delay nonlinear feedback loop is detected, then a deadlock occurs during simulation. Introducing a special simulation node solves this deadlock situation in nonlinear feedback.

The following basic optimization rules are applied:

A signal can be eliminated if no block uses this signal as an argument. Hence, the node that is responsible for computing this variable can be removed as well.

Nodes which perform a no-operation (multiplying with 1, adding zero, interpolation/decimation with a factor 1) can be removed from the graph.

Figure 18:
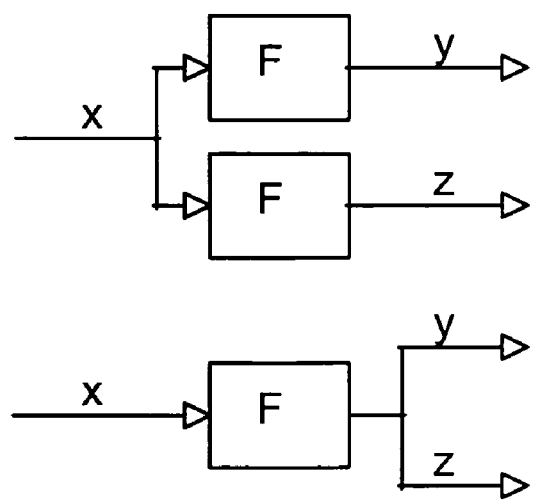
FIG. 18 shows an optimization rule, wherein the occurrence of twice the same operation on a signal is replaced by one such operation.

If identical operations (both linear and non-linear) are performed on the same signal, then this graph is replaced by a single operation (as illustrated in FIG. 18).

The optimization of linear sub-graph can be performed in a systematic way.

1. The optimization of linear graphs starts by identifying—multiple-input, multiple-output—sub-graphs that are build out of linear nodes and sample rate converters.

2. The lowest sampling rate—required to compute the response of the sub-graph-is determined.

3. The sub-graph is rewritten such that the linear nodes can be simulated at the lowest sampling frequency (see e.g. reducing the sampling rate). This implies that all sample rate converters will be localized at the input(s)/output(s) of the rewritten sub-graph. Hence, the sample rate converter nodes are now separated from the linear nodes.

4. The response of the sub-graph which consists out of linear nodes only can be computed using straightforward linear algebra.

Whether this optimization rule is applied to a linear sub-graph or not depends on the gain in computational efficiency that can be expected from this transformation. This gain in efficiency can be computed either on the bases of the number of floating point operations or can be determined experimentally by measuring the computational speed. Simple examples of the described methodology are given below, namely: reducing the sampling rate, summing linear systems, cascading linear system and removing linear feedback loops.

Figure 19:
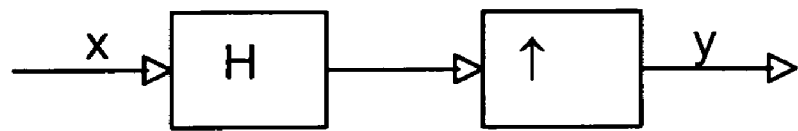
FIG. 19 shows the commutativity of frequency conversions and linear systems.
Figure 19:
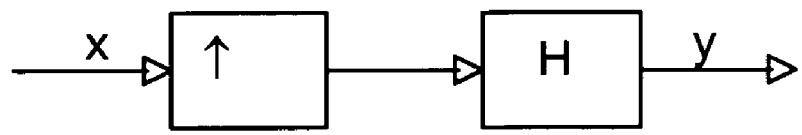

Linear devices and sample rate converters are commutative. Hence, it is possible to compute the response of the linear devices at the lowest sampling rate, as shown in FIG. 19.

Figure 20:
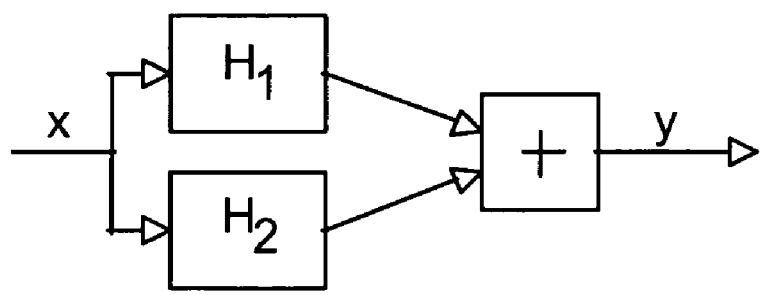
FIG. 20 shows an optimization rule for parallel linear systems.
Figure 20:
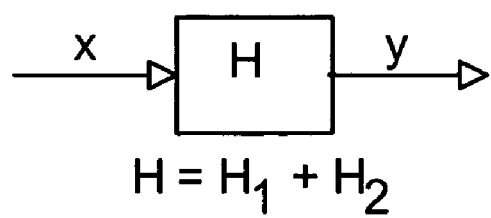

Summing the responses of 2 linear filter, $H_1$ and $H_2$, which depend on the same input signal, x, can be rewritten as a single linear filter, $H=H_1+H_2$, as shown in FIG. 20.

Figure 21:
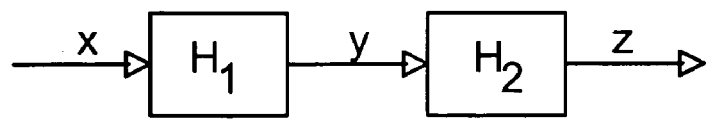
FIG. 21 shows an optimization rule for a cascade of linear systems.
Figure 21:
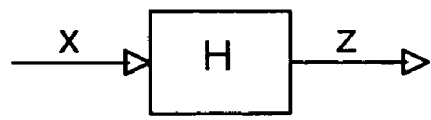

Computing the response of linear filters on sample-by-sample bases outperforms block processing only when the impulse response is sufficiently small. Cascading the different linear functions will increases the impulse response length such that block processing becomes interesting once more. Computing the response of 2 cascaded linear filters using block processing introduces some overhead since the computation of the internal variable requires 1 IFFT (to go from the frequency domain towards the time domain) and 1 FFT (to go to the frequency domain again). These operations will be eliminated if any other node does not use the internal signal, as shown in FIG. 21.

Figure 22:
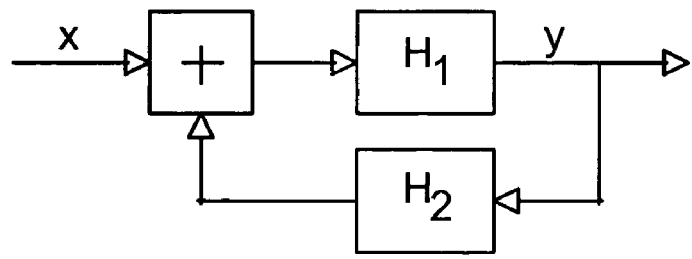
FIG. 22 shows an optimization rule for a feedback of linear systems.
Figure 22:
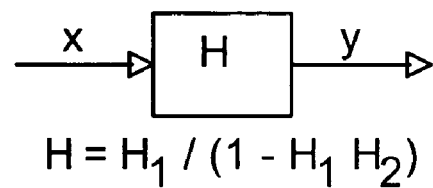

Consider the linear systems $H_1$ and $H_2$ in a feedback loop. This feedback loop can be represented using a feedforward system with $H=H_1/(1-H_1 H_2)$. If the feedback loop has several outputs, then the same rule can be applied to compute the response from the input to every individual output, as shown in FIG. 22.

Figure 23:
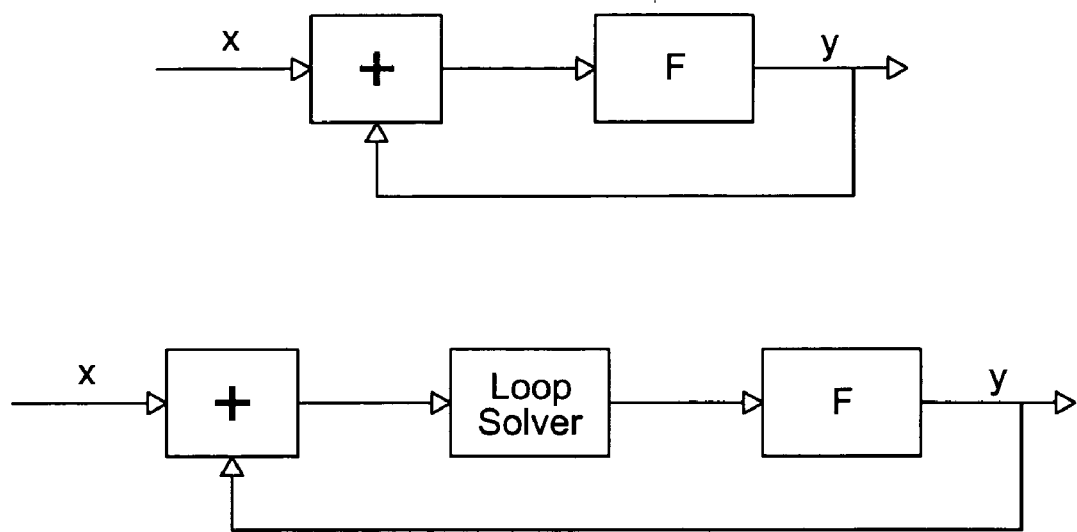
FIG. 23 shows an optimization rule for nonlinear feedback systems.

Introducing a special node which is responsible of solving the nonlinear deadlock situation solves the deadlock situation. This can be done by inserting an additional delay element [Jeruchim, Balaban and Shanmugan, "Simulation of Communication Systems", Plenum] and by loop enrollment, as shown in FIG. 23.

The code generation converts the graph into executable code that can be executed on a virtual machine. It is at this stage that the specifications of the system are converted into an executable model. This means e.g. that the frequency response functions of the analog linear systems are translated into equivalent models in the z-domain using the correct sampling rates and carrier frequencies. The execution code describes a dynamics dataflow model. The synchronization between the different asynchronous blocks is done using the concept of a global timing clock which is accessible by all simulation process. The driving forces behind the dynamic dataflow model are the following:

1. Several digital sub-systems can run asynchronously, although each sub-system can be synchronous on its own.

2. The simulation of the analog and the digital signals are not necessarily synchronous.

3. Block processing should be used as mush as possible. If all systems would be synchronous, then a fixed scheduling of the block processing could be computed. Such scheduling is not possible when asynchronous blocks are present. Hence, it must be possible to switch from block processing to sample-to-sample processing (and back) to prevent deadlock situations. When to switch from block processing to sample-by-sample processing (and back) must be decided by the scheduler of the simulator.

Consider an analog device that is used in either
   a feedforward situation (no feedback)
   a feedback loop and assume that the mode of operation is controlled by a digital switch. The simulator must then switch dynamically from block processing (the feedforward situation) towards sample-by-sample processing (the feedback situation).

The sampling frequencies and the center frequencies for representing an analog signal are only artifacts necessary for simulation purposes. They can be chosen arbitrarily as long as they fulfill the Nyquist criterion. In order to make efficient conversions in sampling frequencies and/or center frequencies possible, the sampling frequencies for the analog circuits are chosen such that the sampling frequency $f_s=f_0/2^k$ for k a positive integer
   the center frequency $f_c=m\ f_0+f_0/2^n$ for m and n positive integers.

This makes it possible to make conversions in sampling frequencies and/or center frequencies using half-band filters [Crochiere R. E. Lawrence R. R., "Multirate Digital Signal Processing", Prentice-Hall, Signal Processing Series]:
   Half-band filters allow a change in sampling frequency of a factor of 2. By imposing an equi-ripple which is equal in both the passband and the stopband, it is possible to obtain a symmetric FIR filter where about 50% of the coefficient are zero. This, together with the symmetry properties, makes it possible to provide an efficient implementation of such FIR filter.
   frequency conversions which can be computed efficiently
   A general conversion in frequency requires the computation of sine and cosine function. By constraining the center frequencies to a grid that is related to the base frequency $f_0$, it is possible to store the sine and cosine functions in lookup tables. This increases the computational speed significantly.

Figure 25:
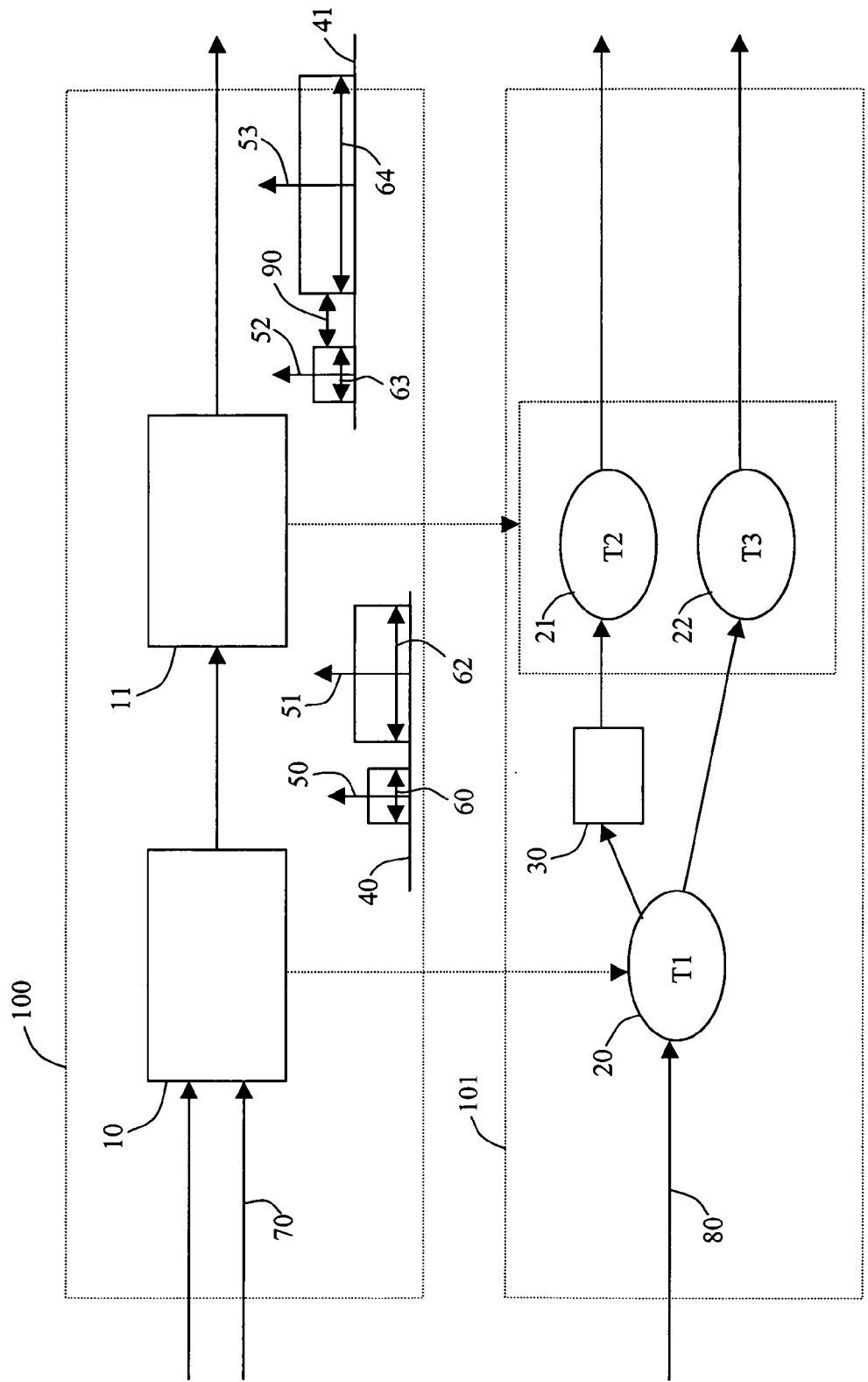
FIG. 25 shows a circuit (100) to be simulated with the invented method.

FIG. 25 depicts a circuit (100) to be simulated. Said circuit comprises of subcircuits (also denoted components or devices) (10) (11) and connections such as (70) in between. The simulation method exploits a computation graph (101), inheriting part of its structure from the topology of the circuit. Said graph comprises computational nodes (20), (21) and (22) and edges such as (80). Node 20 relates to subcircuit (10), while nodes (21) and (22) relate to circuit (11). In said graph extra nodes, for instance (30) can be introduced, for instance upsampling or downsampling nodes. The signal representation (40) used for instance in the connection between block (10) and (11) comprises a plurality of carriers (50), (51), each being modulated with a bandpass signals (60), (62) (the arrows indicated the bandwidth of said signals). The signal represenation (41) differs from said signal representation (40) in the carriers and in the bandwidth of its bandpass signals. Note also the distance (90) between the bandpass signals (63) and (64). Said distance can be evaluated and if said distance is below a certain threshold, a further simplification of the signal representation can be performed.

Figure 26:
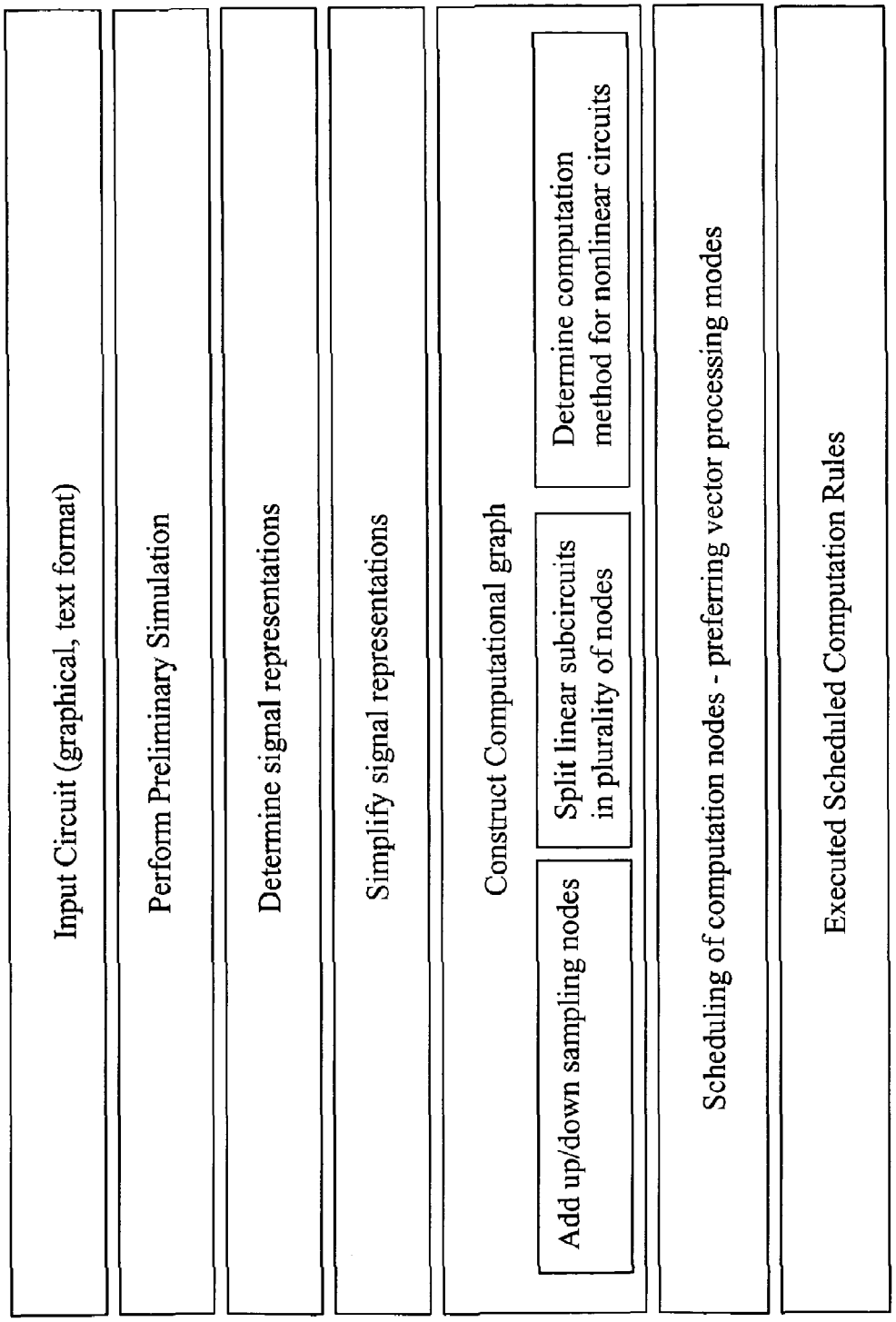
FIG. 26 shows in a top-down representation a possible flow-chart for the invented method.

FIG. 26 shows is a top-down representation a possible flow-chart for the invented method. First the circuit to be simulated is entered into a suitable software environment in either a graphical or a text format (computer language). One can optionally perform a preliminary, preferably short simulation (any simulation approach can be used therefore), and determine therefrom the signal represenations used in the fast and extensive simulation. Futher an optionally signal represenation simplification step, for instance merging of bandwidth signals with a short distance (see (90) in FIG. 25) in between. Then a computational graph is constructed, said construction step comprises steps of adding decimators and interpolators, splitting a node relating to a linear subcircuit into a plurality of nodes and a step of selecting an apprioriate computation method for nonlinear circuits. Then a scheduling step is performed which focusses on improving the amount of vector processing as this increases the simulation speed considerably.

Figure 27:
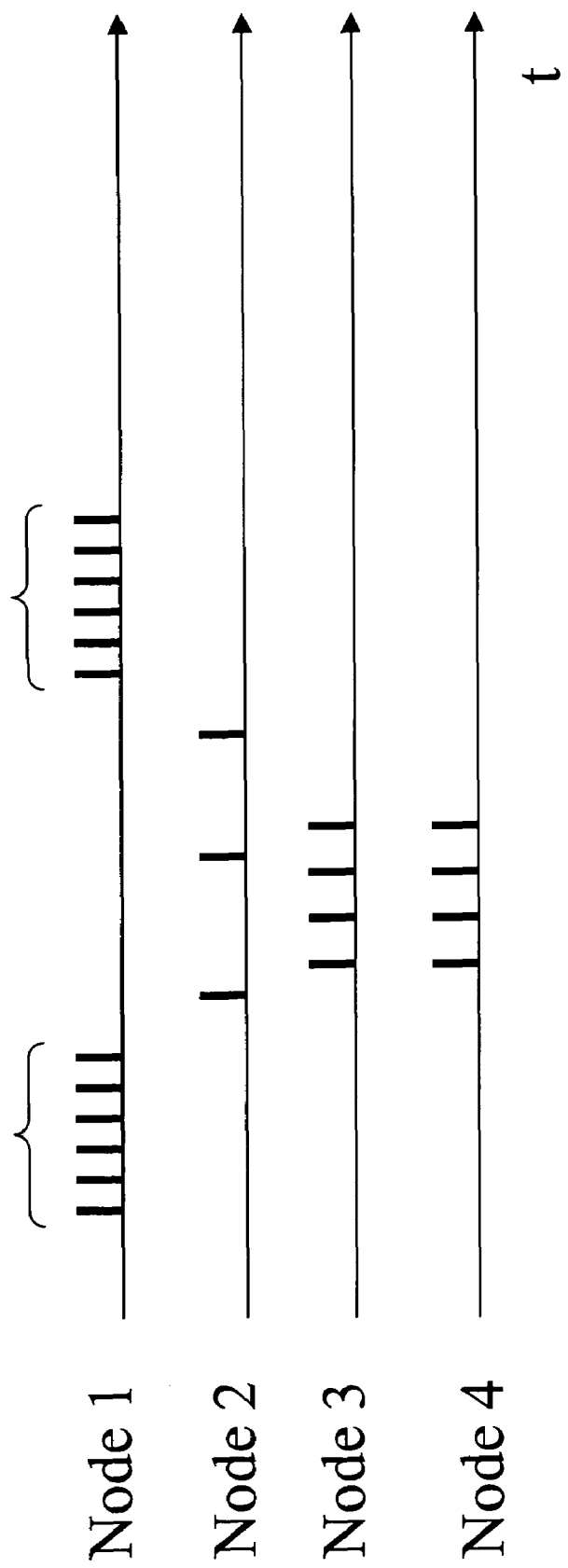
FIG. 27 shows a potential scheduling that can be obtained by the schedular of the invention and enabled by the flexible approach described according to the invention.

FIG. 27 represents scheduling that can be obtained using the described approach. It is shown that vector processing as used here for node 1 is possible. With vector processing is meant that a plurality of samples are calculated for a node before another node is executed. It is also shown that the time step between the computations can differ from node to node (compare node 1 and 2 or node 2 and 3). It is also shown that execution of the computation nodes can be performed simultaneously as shown for node 3 and 4. With scheduling is meant placing the execution of the computations of each node in time, while exploiting the flexibility of the computation step (due to the bandwidth flexibility). The scheduling freedom is exploited for increasing the computation step, for instance by using as much vector processing as possible.

What is claimed is:

1. A digital apparatus for simulating signals of a simulated system, said system being simulated comprising subsystems and connections between said subsystems, said signals being referred to said connections, said apparatus comprising:
   means for entering a representation of said system;
   means for transforming said representation into a computational graph, said computation graph comprising at least one of computation nodes, each computation node having a computation rule;
   a scheduler for scheduling the execution of said computation rules of said computation nodes in time, said scheduler being adapted for scheduling the execution of said computation rule for each computation node such that for a maximum amount of computation nodes at least a sequence of computations can be performed without interruptions;
   means for execution said computation rules in the order determined by said scheduler.

2. The apparatus recited in claim 1, wherein the apparatus is further adapted such that at least one of said signals is represented by a sum of at least two carriers, each carrier being modulated by a bandpass signal, wherein at least two of said bandpass signals have a different bandwidth.

3. The apparatus recited in claim 1, wherein the apparatus is further adapted such that at least two of said signals are represented by a sum of at least two carriers, each carrier being modulated by a bandpass signal, wherein at least two of said signals have a representation being different from signal to signal in either at least one carrier frequency or in at least one bandwidth for a carrier frequency common for said two signals.

4. The apparatus recited in claim 1 wherein the transforming means comprises:
   means for adding decimators and interpolators;
   means for splitting a node relating to a linear subcircuit into a plurality of nodes; and
   means for selecting an appropriate computation method for nonlinear circuits.

5. The apparatus recited in claim 1, wherein the computation nodes comprise a plurality of nodes each having a different level of priority, and wherein the scheduler is configured to schedule the execution for the node having the highest level of priority.

6. The apparatus recited in claim 5, wherein the plurality of computation nodes comprise:
   a first node which is not ready for execution;
   a second node which is not in a feedback loop and ready for sample-by-sample execution;
   a third node which is in a feedback loop and ready for sample-by-sample execution; and
   a fourth node which is ready for vector processing.

7. A digital apparatus for simulating signals in a simulated system, the apparatus comprising:
   an entering section configured to enter a representation of said system;
   a transforming section configured to transform the representation into a computational graph, the computation graph comprising a plurality of computation nodes, each computation node having a computation rule;
   a scheduler configured to schedule the execution of the computation rules of the computation nodes in time, the scheduler being adapted to schedule the execution of the computation rule for each computation node such that for a maximum amount of computation nodes at least a sequence of computations can be performed without interruptions; and
   an execution section configured to execute the computation rules in the order determined by the scheduler.

* * * * *

UNITED STATES PATENT AND TRADEMARK OFFICE
CERTIFICATE OF CORRECTION

PATENT NO. : 6,937,969 B1
APPLICATION NO. : 09/591026
DATED : August 30, 2005
INVENTOR(S) : Vandersteen et al.

It is certified that error appears in the above-identified patent and that said Letters Patent is hereby corrected as shown below:

| Column | Line | Error Description |
|---|---|---|
| First page Col. 1 (Assignees) | 3 | Delete "Brussels" and insert -- Brussel --, therefor. |
| First page Col. 2 (Other Publications) | 3 | Delete "Acess Muli-Rate" and insert -- Access Multi-Rate --, therefor. |
| First page Col. 2 (Other Publications) | 9 | Delete "Discret" and insert -- Discrete --, therefor. |
| First page Col. 2 (Other Publications) | 13 | Delete "mulitmedia and insert -- multimedia --, therefor. |
| Page 2 Col. 1 (Other Publications) | 7 | Before "Military" delete "." and insert -- , --, therefor. |
| Page 2 Col. 1 (Other Publications) | 10 | Delete "Circuits:," and insert -- Circuits, --, therefor. |
| Page 2 Col. 1 (Other Publications) | 16 | Delete "et al." and insert -- et al., --, therefor. |
| Page 2 Col. 2 (Other Publications) | 1 | Delete "Potolemy" and insert -- Ptolemy --, therefor. |
| Page 2 Col. 2 (Other Publications) | 1-2 | Delete "http://www.ptolemy.eecs.berkley.edu/main/htm)" and insert -- (http://www.ptolemy.eecs.berkeley.edu//main.htm) --, therefor. |
| Page 2 Col. 2 (Other Publications) | 12 | Delete "et al..," and insert -- et al., --, therefor. |
| Page 2 Col. 2 (Other Publications) | 13 | After "(1998)" insert -- IEEE --. |
| Page 2 Col. 2 (Other Publications) | 15 | Delete "System" and insert -- Systems --, therefor. |

UNITED STATES PATENT AND TRADEMARK OFFICE
CERTIFICATE OF CORRECTION

PATENT NO. : 6,937,969 B1
APPLICATION NO. : 09/591026
DATED : August 30, 2005
INVENTOR(S) : Vandersteen et al.

It is certified that error appears in the above-identified patent and that said Letters Patent is hereby corrected as shown below:

| Column | Line | |
|---|---|---|
| 1 | 7 | After "60/209,400" delete ";" and insert -- , --, therefor. |
| 1 | 67 | Delete "state of the art" and insert -- state-of-the-art --, therefor. |
| 2 | 20 | After "bases)" insert -- . --. |
| 3 | 27 (Approx.) | Delete "non-interupted" and insert -- non-interrupted --, therefor. |
| 3 | 37-38 | Delete "represenations" and insert -- representations --, therefor. |
| 3 | 46 | Delete "dedictated" and insert -- dedicated --, therefor. |
| 4 | 65-66 | Delete "computerlanguage," and insert -- computer language, --, therefor. |
| 5 | 23 | Delete "modulad" and insert -- modulated --, therefor. |
| 5 | 26 | Delete "complexe" and insert -- complex --, therefor. |
| 5 | 61 | After "t-Ti," insert -- ..., --. |
| 6 | 11 | Delete "attacted" and insert -- attached --, therefor. |
| 6 | 20 | After "t-Ti," insert -- ..., --. |
| 6 | 35 | Delete "same" before "computation". |
| 7 | 15 (Approx.) | Delete "represenation" and insert -- representation --, therefor. |
| 7 | 35 | Delete "rewritting" and insert -- rewriting --, therefor. |
| 7 | 38 | After "signal" insert -- . --. |
| 7 | 54 | Delete "$\Sigma_i[X_{Ki}(t)$" and insert -- $\Sigma_i[X_{Li}(t)$ --, therefor. |
| 7 | 55 | Delete "t]" and insert -- t)] --, therefor. |
| 7 | 55 | After "Here" delete ",". |
| 8 | 67 | After "form" insert -- : --. |
| 9 | 10 | After "that" insert -- : --. |
| 9 | 11 | Delete "$\Sigma_i-(k_il_i)=m$" and insert -- $\Sigma_i-(k_i+l_i)=m$ --, therefor. |
| 9 | 12 | Delete "$K_{k_i,l_i}$" and insert -- $K_{k_i,l_i}$ --, therefor. |

UNITED STATES PATENT AND TRADEMARK OFFICE
CERTIFICATE OF CORRECTION

PATENT NO. : 6,937,969 B1
APPLICATION NO. : 09/591026
DATED : August 30, 2005
INVENTOR(S) : Vandersteen et al.

It is certified that error appears in the above-identified patent and that said Letters Patent is hereby corrected as shown below:

| Column | Line | |
|---|---|---|
| 10 | 62 | Delete "represenation" and insert -- representation --, therefor. |
| 11 | 67 | Delete "represenations" and insert -- representations --, therefor. |
| 12 | 42 (Approx.) | Delete "to calculated" and insert -- to calculate --, therefor. |
| 13 | 23 | After "aliasing" insert -- . --. |
| 13 | 48-49 | Delete "analog connections; digital..................clock connections." and insert the same after "found;" at line 47. |
| 13 | 55 | Delete "A analog" and insert -- An analog --, therefor. |
| 15 | 17-18 | Delete "(EquiLowpassSignal)" and insert -- (EquiLowPassSignal) --, therefor. |
| 15 | 34 (Approx.) | Delete "(EquiLowpassSignal)" and insert -- (EquiLowPassSignal) --, therefor. |
| 15 | 45 | After "V(g)" insert -- . --. |
| 16 | 22 | After "satisfied" insert -- . --. |
| 16 | 57 | Delete "FitI" and insert -- Flt1 --, therefor. |
| 17 | 26 | After "H2)" insert -- . --. |
| 19 | 40 | After "feedback" insert -- . --. |
| 19 | 65 | Delete "build" and insert -- built --, therefor. |
| 20 | 31 | Delete "increases" and insert -- increase --, therefor. |
| 21 | 38-44 | Delete "Half-band filters allow .............................. such FIR filter." and insert the same paragraph after "Series]:", at line 37. |
| 21 | 66 | Delete "represenation" and insert -- representation --, therefor. |
| 22 | 13 | Delete "represenations" and insert -- representations --, therefor. |
| 22 | 14 | Delete "Futher" and insert -- Further --, therefor. |
| 22 | 15 | Delete "represenation" and insert -- representation --, therefor. |
| 22 | 20 | Delete "apprioriate" and insert -- appropriate --, therefor. |

UNITED STATES PATENT AND TRADEMARK OFFICE
CERTIFICATE OF CORRECTION

PATENT NO.      : 6,937,969 B1
APPLICATION NO. : 09/591026
DATED           : August 30, 2005
INVENTOR(S)     : Vandersteen et al.

It is certified that error appears in the above-identified patent and that said Letters Patent is hereby corrected as shown below:

| Column | Line | |
|--------|------|---|
| 23 | 7 | In Claim 4, after "claim 1" insert -- , --. |

Signed and Sealed this

Thirtieth Day of January, 2007

JON W. DUDAS
*Director of the United States Patent and Trademark Office*